US010047473B2

(12) United States Patent
Kwon et al.

(10) Patent No.: US 10,047,473 B2
(45) Date of Patent: *Aug. 14, 2018

(54) LAUNDRY TREATING APPARATUS

(71) Applicant: LG ELECTRONICS INC., Seoul (KR)

(72) Inventors: Yongwoo Kwon, Seoul (KR); Seungji Yong, Seoul (KR); Kangwoon Cheon, Seoul (KR); Jaehoon Choi, Seoul (KR); Jungjin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/337,586

(22) Filed: Oct. 28, 2016

(65) Prior Publication Data

US 2017/0121890 A1 May 4, 2017

Related U.S. Application Data

(60) Provisional application No. 62/249,355, filed on Nov. 2, 2015.

(30) Foreign Application Priority Data

Jan. 5, 2016 (KR) .......................... 10-2016-0001218
Apr. 1, 2016 (KR) .......................... 10-2016-0040453

(51) Int. Cl.
*D06F 37/26* (2006.01)
*D06F 39/00* (2006.01)
(Continued)

(52) U.S. Cl.
CPC ............ *D06F 39/005* (2013.01); *D06F 33/02* (2013.01); *D06F 37/10* (2013.01); *D06F 37/266* (2013.01);
(Continued)

(58) Field of Classification Search
CPC ...................................................... D06F 37/266
See application file for complete search history.

(56) References Cited

U.S. PATENT DOCUMENTS 3,042,471 A  7/1962 Haslup
5,358,773 A  10/1994 Fujii et al.
(Continued)

FOREIGN PATENT DOCUMENTS

CN  1936157  3/2007
CN  2898087  5/2007
(Continued)

OTHER PUBLICATIONS

Korean Search Report dated Apr. 15, 2016 issued in Application No. 10-2016-0040453.

(Continued)

*Primary Examiner* — Jason Ko
(74) *Attorney, Agent, or Firm* — KED & Associates, LLP

(57) ABSTRACT

A laundry treating apparatus includes a body provided with a laundry inlet; and a door configured to open and close the laundry inlet, wherein the door includes a door frame; a door cover mounted at one side of the door frame, and provided with a light transmitting region; a mounting frame mounted at the other side of the door frame; a display mounted on the mounting frame to display visual information through the light transmitting region of the door cover; and a display gasket disposed between the door frame and the mounting frame, and formed to surround the display.

14 Claims, 20 Drawing Sheets

(51) Int. Cl.
| | | |
|---|---|---|
| *D06F 37/10* | (2006.01) | |
| *D06F 37/30* | (2006.01) | |
| *D06F 39/02* | (2006.01) | |
| *D06F 33/02* | (2006.01) | |
| *D06F 58/28* | (2006.01) | |
| *G06F 3/041* | (2006.01) | |
| *G05B 19/409* | (2006.01) | |
| *H05K 7/14* | (2006.01) | |
| *H05K 1/02* | (2006.01) | |
| *D06F 58/02* | (2006.01) | |

(52) U.S. Cl.
CPC .......... *D06F 37/304* (2013.01); *D06F 39/02* (2013.01); *D06F 58/28* (2013.01); *G05B 19/409* (2013.01); *G06F 3/0416* (2013.01); *H05K 1/028* (2013.01); *H05K 1/0213* (2013.01); *H05K 7/1427* (2013.01); *D06F 58/02* (2013.01); *D06F 2058/2803* (2013.01); *G05B 2219/23058* (2013.01); *G05B 2219/2633* (2013.01); *G06F 2203/04102* (2013.01); *G06F 2203/04103* (2013.01); *G06F 2203/04107* (2013.01)

(56) References Cited

U.S. PATENT DOCUMENTS

| | | | |
|---|---|---|---|
| 8,151,603 | B2 | 4/2012 | Kang et al. |
| 9,268,068 | B2 | 2/2016 | Lee |
| 9,708,749 | B2 | 7/2017 | Woo et al. |
| 9,810,590 | B2 | 11/2017 | Huppi et al. |
| 2006/0059710 | A1 | 3/2006 | Kim |
| 2006/0117813 | A1 | 6/2006 | Ha et al. |
| 2006/0218975 | A1 | 10/2006 | Graute et al. |
| 2008/0273016 | A1 | 11/2008 | Helgesen |
| 2009/0064534 | A1 | 3/2009 | LeClerc |
| 2009/0121970 | A1 | 5/2009 | Ozbek |
| 2010/0187023 | A1 | 7/2010 | Min |
| 2010/0245271 | A1 | 9/2010 | Park |
| 2011/0296628 | A1 | 12/2011 | Jenkins et al. |
| 2012/0036900 | A1 | 2/2012 | Hong et al. |
| 2012/0049703 | A1 | 3/2012 | Fang et al. |
| 2013/0076220 | A1 | 3/2013 | Yeom et al. |
| 2013/0234573 | A1 | 9/2013 | Coxon |
| 2014/0016290 | A1 | 1/2014 | Lee et al. |
| 2014/0063367 | A1 | 3/2014 | Yang et al. |
| 2014/0157673 | A1 | 6/2014 | Bazzinotti |
| 2015/0123525 | A1 | 5/2015 | Woo et al. |
| 2017/0121886 | A1 | 5/2017 | Kwon et al. |
| 2017/0121898 | A1 | 5/2017 | Kwon et al. |

FOREIGN PATENT DOCUMENTS

| | | |
|---|---|---|
| CN | 101096810 | 1/2008 |
| CN | 201103058 | 8/2008 |
| CN | 101805979 | 8/2010 |
| CN | 101818439 | 9/2010 |
| CN | 102191653 | 9/2011 |
| CN | 102317534 | 1/2012 |
| CN | 202116878 | 1/2012 |
| CN | 102560960 | 7/2012 |
| CN | 102733135 | 10/2012 |
| CN | 204298638 | 4/2015 |
| CN | 104674521 | 6/2015 |
| DE | 2 261 275 | 5/1974 |
| DE | 202 10 707 | 11/2003 |
| DE | 10-2005-024934 | 12/2006 |
| DE | 102005058898 | 12/2006 |
| DE | 20 2009 005 678 | 6/2009 |
| DE | 10 2009 007 920 | 4/2010 |
| DE | 10 2013 001 682 | 9/2013 |
| DE | 10 2013 208 851 | 11/2014 |
| EP | 1 595 992 | 11/2005 |
| EP | 2 077 349 | 7/2009 |
| EP | 2 161 364 | 3/2010 |
| EP | 2 581 485 | 4/2013 |
| EP | 2 742 843 | 6/2014 |
| EP | 2 837 728 | 2/2015 |
| EP | 2 843 105 | 3/2015 |
| EP | 2 868 795 | 5/2015 |
| EP | 3040467 | 7/2016 |
| GB | 2070130 | 9/1981 |
| GB | 2 118 580 | 11/1983 |
| JP | H 08-84891 | 4/1996 |
| JP | 2006-229319 | 8/2006 |
| JP | 2011-234785 | 11/2011 |
| JP | 2013-188273 | 9/2013 |
| JP | 2014-001984 | 1/2014 |
| KR | 20-1999-0013707 | 4/1999 |
| KR | 20-1999-0029441 | 7/1999 |
| KR | 20-2000-0000962 | 1/2000 |
| KR | 20-0228519 | 9/2001 |
| KR | 20-0245382 | 10/2001 |
| KR | 10-2002-0048576 | 6/2002 |
| KR | 20-0281165 | 7/2002 |
| KR | 10-2003-0011457 | 2/2003 |
| KR | 10-0465690 | 1/2005 |
| KR | 10-2006-0109164 | 10/2006 |
| KR | 10-0662289 | 1/2007 |
| KR | 10-2007-0060063 | 6/2007 |
| KR | 10-0730925 | 6/2007 |
| KR | 10-0741111 | 7/2007 |
| KR | 10-2008-0000442 | 1/2008 |
| KR | 10-0790539 | 1/2008 |
| KR | 10-2008-0058123 | 6/2008 |
| KR | 10-2009-0115005 | 11/2009 |
| KR | 10-2010-0120049 | 11/2010 |
| KR | 10-2011-0012307 | 2/2011 |
| KR | 10-2011-0067886 | 6/2011 |
| KR | 10-2011-0129902 | 12/2011 |
| KR | 10-2011-0130089 | 12/2011 |
| KR | 10-1097306 | 12/2011 |
| KR | 10-2014-0015017 | 2/2014 |
| KR | 10-2014-0016197 | 2/2014 |
| KR | 10-2015-0006262 | 1/2015 |
| KR | 10-2015-0006264 | 1/2015 |
| KR | 10-2015-0061144 | 6/2015 |
| KR | 10-2015-0066140 | 6/2015 |
| KR | 10-2015-0090754 | 8/2015 |
| KR | 10-2015-0120230 | 10/2015 |
| KR | 10-2015-0138903 | 12/2015 |
| WO | WO 2005/075727 | 8/2005 |
| WO | WO 2010/094959 | 8/2010 |
| WO | WO 2010/128729 | 11/2010 |
| WO | WO 2011/014018 | 2/2011 |
| WO | WO 2011/149319 | 12/2011 |
| WO | WO 2014/024393 | 2/2014 |
| WO | WO 2016/078191 | 5/2016 |

OTHER PUBLICATIONS

Korean Office Action dated May 19, 2016 issued in Application No. 10-2016-0040453.
International Search Report dated Jan. 23, 2017 issued Application No. PCT/KR2016/012366.
International Search Report dated Jan. 24, 2017 issued Application No. PCT/KR2016/012365.
International Search Report dated Jan. 25, 2017 issued Application No. PCT/KR2016/012361.
Korean Search Report dated Apr. 15, 2016 issued in Application No. 10-2016-0040447.
Korean Search Report dated Apr. 15, 2016 issued in Application No. 10-2016-0040448.
Korean Search Report dated Apr. 15, 2016 issued in Application No. 10-2016-0040450.
Korean Office Action dated Apr. 15, 2016 issued in Application No. 10-2016-0040451.
Korean Search Report dated Apr. 15, 2016 issued in Application No. 10-2016-0040455.
Korean Search Report dated Apr. 15, 2016 issued in Application No. 10-2016-0040456.

(56) References Cited

OTHER PUBLICATIONS

Korean Search Report dated Apr. 15, 2016 issued in Application No. 10-2016-0040457.
Korean Office Action dated Apr. 20, 2016 issued in Application No. 10-2016-0040455.
Korean Office Action dated Apr. 20, 2016 issued in Application No. 10-2016-0040456.
Korean Office Action dated Apr. 20, 2016 issued in Application No. 10-2016-0040457.
Korean Office Action dated May 5, 2016 issued in Application No. 10-2016-0040450.
Korean Office Action dated May 31, 2016 issued in Application No. 10-2016-0040448.
Korean Office Action dated Jun. 20, 2016 issued in Application No. 10-2016-0040447.
Korean Office Action dated Jun. 21, 2016 issued in Application No. 10-2016-0040452.
Machine English Translation of KR 1020150006264 (Year: 2015).
U.S. Office Action dated Nov. 30, 2017 issued in U.S. Appl. No. 15/337,689.
U.S. Office Action dated Dec. 29, 2017 issued in U.S. Appl. No. 15/337,206.
U.S. Office Action dated Jan. 25, 2018 issued in U.S. Appl. No. 15/340,235.
U.S. Office Action dated Feb. 22, 2018 issued in U.S. Appl. No. 15/339,265.
U.S. Office Action dated Sep. 25, 2017 issued in U.S. Appl. No. 15/340,235.
U.S. Office Action dated Sep. 28, 2017 issued in U.S. Appl. No. 15/338,874.
European Search Report dated Mar. 29, 2017 issued in Application No. 16196148.7.
Korean Office Action dated Mar. 30, 2017 issued in Application No. 10-2016-0040455.
European Search Report dated Mar. 31, 2017 issued in Application No. 16196150.3.
European Search Report dated Apr. 3, 2017 issued in Application No. 16196149.5.
European Search Report dated Apr. 5, 2017 issued in Application No. 16196185.9.
European Search Report dated Apr. 9, 2017 issued in Application No. 16196353.3.
European Search Report dated Apr. 10, 2017 issued in Application No. 16196360.8.
European Search Report dated Apr. 11, 2017 issued in Application No. 16196340.0.
European Search Report dated Apr. 11, 2017 issued in Application No. 16196351.7.
European Search Report dated Apr. 18, 2017 issued in Application No. EP16196298.0.
Chinese Office Action dated May 3, 2017 issued in Application No. 201610452886.2 (with English Translation).
Korean Office Action dated Nov. 15, 2016 issued in Application No. 10-2016-0040455.
Korean Office Action dated Nov. 15, 2016 issued in Application No. 10-2016-0040456.
Korean Office Action dated Nov. 16, 2016 issued in Application No. 10-2016-0040457.
Korean Office Action dated May 19, 2016 issued in Application No. KR 10-2016-0040453 (with English Translation).
Korean Decision of Rejection dated Sep. 29, 2016 issued in Application No. KR 10-2016-0040453 (with English Translation).
Korean Notice of Allowance dated Dec. 27, 2016 issued in Application No. KR 10-2016-0040453 (with English Translation).
Chinese Office Action dated May 27, 2017 issued in Application No. 201610457444.7 (with English translation).
Chinese Office Action dated Jun. 26, 2017 issued in Application No. 201610452893.2 (with English translation).
Chinese Office Action dated Aug. 3, 2017 issued in Application No. 201610509856.0 (with English translation).
Korean Office Action dated Sep. 26, 2017 issued in Application No. 10-2016-0040456.
Chinese Office Action dated Sep. 28, 2017 issued in Application No. 201610460998.2 (with English Translation).
Chinese Office Action dated Oct. 10, 2017 issued in Application No. 201610461531.X (with English Translation).
Chinese Office Action dated Oct. 18, 2017 issued in Application No. 201610482128.5 (with English Translation).
U.S. Notice of Allowance dated Jan. 23, 2018 issued in U.S. Appl. No. 15/338,874.
U.S. Notice of Allowance dated Mar. 2, 2018 issued in U.S. Appl. No. 15/337,689.
U.S. Notice of Allowance dated Mar. 16, 2018 issued in U.S. Appl. No. 15/337,206.
U.S. Office Action dated Apr. 6, 2018 issued in U.S. Appl. No. 15/335,852.
KR 2002-0048576 (previously cited) Translated Description, 5 pages (Year: 2002).
CN 201103058Y (previously cited) Translated Description, 11 pages (Year: 2008).
U.S. Office Action dated Apr. 20, 2018 issued in co-pending U.S. Appl. No. 15/339,055.

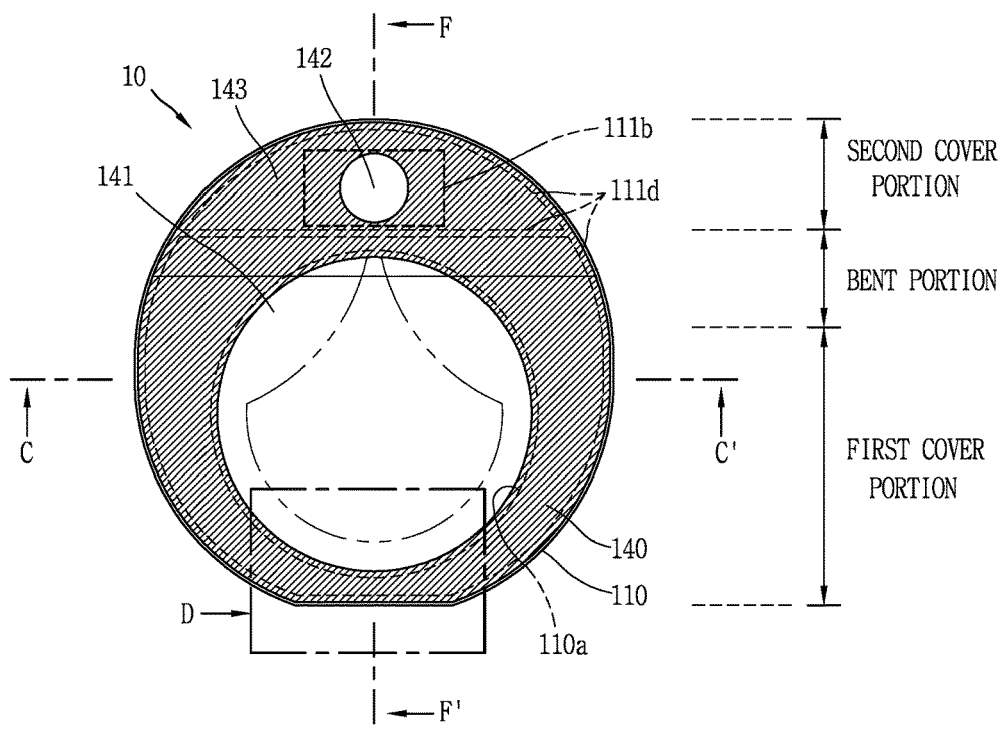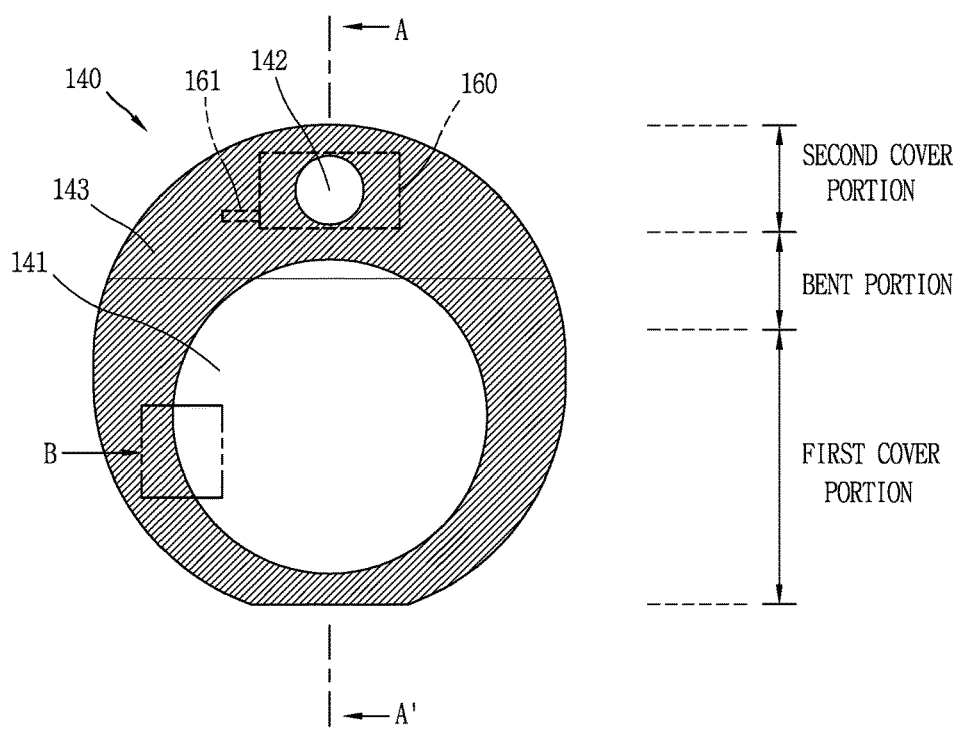

LAUNDRY TREATING APPARATUS

CROSS-REFERENCE TO RELATED APPLICATION(S)

Pursuant to 35 U.S.C. § 119(a), this application claims the benefit of the earlier filing date and the right of priority to U.S. Provisional Application No. 62/249,355, filed on Nov. 2, 2015, Korean Application No. 10-2016-0001218, filed on Jan. 5, 2016, and Korean Application No. 10-2016-0040453, filed on Apr. 1, 2016, the contents of which is incorporated by reference herein in its entirety.

BACKGROUND

1. Field

The present disclosure relates to a laundry treating apparatus having a door for opening and closing a laundry inlet of a body.

2. Background

A laundry treating apparatus may include an apparatus for washing laundry, an apparatus for drying laundry, and an apparatus capable of performing washing and drying operations at the same time. In a laundry treating apparatus, the washing of laundry may be a cycle of removing contaminants adhered to the laundry through the action of water and detergent, and the drying of laundry may be a cycle of removing moisture contained in the laundry through a hot air supply device provided in the laundry treating apparatus.

A typical laundry treating apparatus may include a body configured to form an appearance thereof and provided with a laundry inlet, a laundry accommodation portion or space provided within the body, a drive unit (or drive) configured to rotate a drum constituting the laundry accommodation portion, a door configured to open and close the laundry inlet, and a control unit (or controller) configured to display visual information associated with a cycle treated on the laundry treating apparatus for a user and receive the user's input.

Such a typical laundry treating apparatus has been designed to perform an inherent function capable of opening and closing the laundry inlet and viewing the laundry accommodation portion. Furthermore, the control unit may typically be provided on the body, and provided with a plurality of buttons or knobs to briefly display only predetermined cycles in an on/off manner or the like, and manipulating them.

The differentiation between a door and a control unit has been a hindrance to the simple appearance of the laundry treating apparatus, and input and output interfaces between the laundry treating apparatus and the user have been more likely to stay in a low-level manner.

As a result, studies for placing the control unit on a door, and implementing the control unit with a touch screen have been carried out. The related technologies can be also found in the Korean Patent Publication Nos. 10-2011-0130089 (published on Dec. 5, 2011) and 10-2015-0006264 (published on Jan. 16, 2015) whose disclosures are hereby incorporated by references in their entirety. However, studies on an integrated aesthetic sense for the door and touch screen as well as on a door structure capable of arousing advanced sensibility at low cost are still not entirely satisfactory.

In order to couple a door cover to a door frame, an adhesive is typically used along with a mechanical fastening structure using a bracket, a hook or the like. However, when a door cover with a glass material is used to give a high-quality feeling, it may be difficult to use such a mechanical fastening structure. Moreover, when the door cover is formed in a circular shape, it may be difficult to align a correct installation position for the door frame.

Furthermore, the adhesive may be leaked during the process of coupling a door cover to a door frame through the adhesive, thereby causing the deterioration of appearance quality. In order to prevent the problem, the adhesive may be coated at an inner side of the door frame located far away from an edge portion thereof, which may result in the deterioration of the joint strength, and have a problem of causing foreign substances to easily be infiltrated through a gap between the door cover and the door frame.

When the door has a configuration of opening and closing a laundry inlet, when a touch screen is provided on the door, moisture may likely leak into electronic elements constituting the touch screen. Accordingly, the sealing of the electronic elements may be a key point in the aspect of securing the reliability of driving the touch screen.

BRIEF DESCRIPTION OF THE DRAWINGS

Embodiments will be described in detail with reference to the following drawings in which like reference numerals refer to like elements, and wherein:

FIG. 4 is a front view of the door illustrated in FIG. 1;

FIG. 5 is a rear view of a door cover illustrated in FIG. 3;

DETAILED DESCRIPTION

Figure 1:
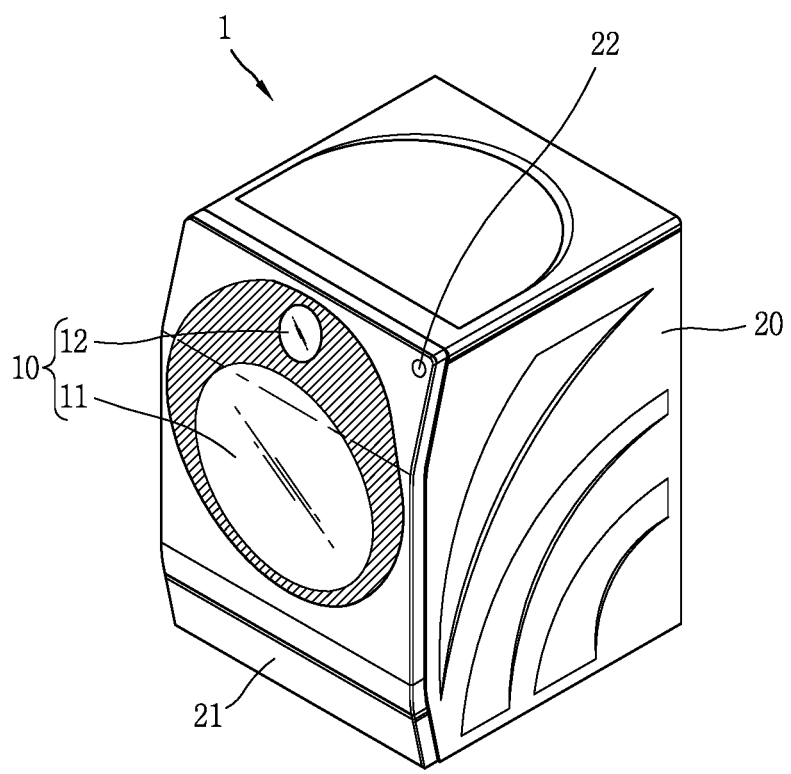
FIG. 1 is a perspective view illustrating a laundry treating apparatus according to an embodiment.

Referring to the present drawings, a laundry treating apparatus 1 may include a body 20 and a door 10. The body 20 may include a laundry inlet 20a forming an appearance of the laundry treating apparatus 1 to which laundry is input. The laundry inlet 20a may be formed on a front side portion of the body 20 having a hexahedral shape.

A laundry accommodation portion or space into which laundry is accommodated through the laundry inlet 20a may be provided within the body 20. When the laundry treating apparatus 1 is configured as an apparatus for drying laundry, the laundry accommodation portion may be configured with a drum 40 rotatably provided within the body 20. When the laundry treating apparatus 1 is configured as an apparatus capable of washing and drying laundry at the same time, the laundry inlet may be configured with a tub provided within the body 20 to store wash water and a drum 40 rotatably provided within the tub to accommodate laundry.

A drive unit configured to rotate the drum 40 may be provided in the body 20. The drive unit may include a motor configured to generate a driving force and a belt configured to rotate the drum 40 using the driving force.

A detergent supply unit or device may be provided in the body 20 to be pulled out in a withdrawable manner. A cover 21 covering the detergent supply unit may be rotatably configured in a vertical direction.

A power button 22 may be provided in the body 20 to turn on or off the power of the laundry treating apparatus 1. When a display 12 which will be described later is configured with a touch screen, the display 12 may be configured to turn on or off the power of the laundry treating apparatus 1 through a touch input to the touch screen. In this case, the power button 22 may not be provided to implement a simpler appearance.

The door 10 may be relatively rotatable with respect to the body 20 to open or close the laundry inlet 20a. The door 10 may be provided to rotate with respect to body 20 by a hinge unit (or hinge) 30.

The body 20 may include a door accommodation portion or space 20b recessed in an inward direction on an outer surface of the body 20 to have the laundry inlet 20a therewithin. When the door 10 is closed, the door 10 may be accommodated into the door accommodation portion 20b, and an edge portion of the outer surface of the door cover may be aligned on the same plane as an outer surface of the body 20 adjacent thereto.

Figure 2A:
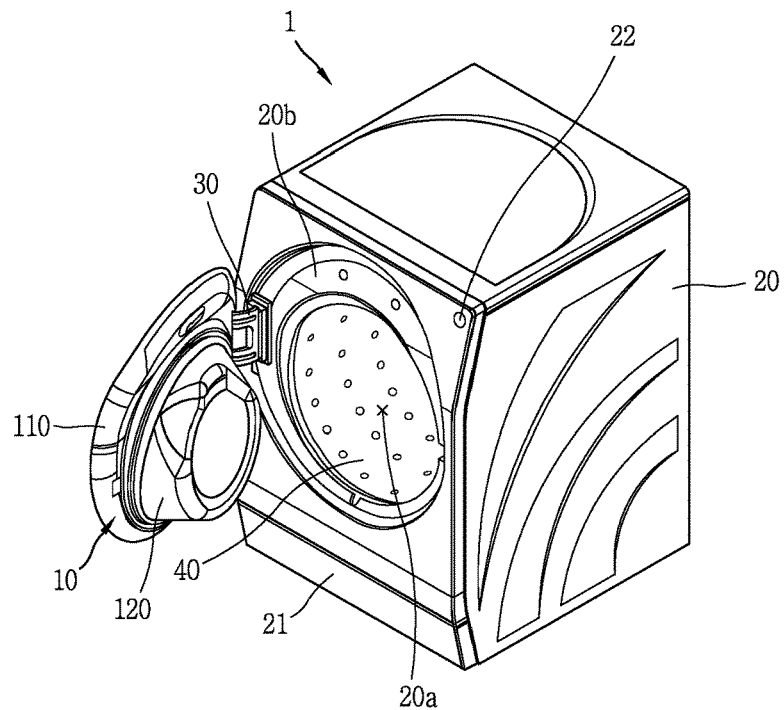
FIG. 2A is a conceptual view illustrating a configuration in which a door illustrated in FIG. 1 is primarily rotated to open a laundry inlet.
Figure 2B:
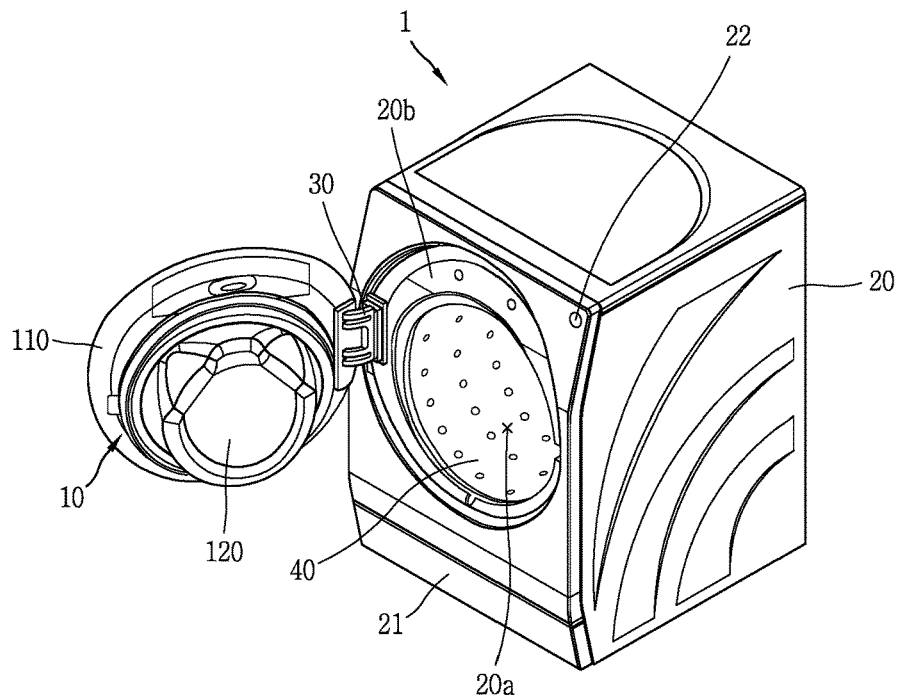
FIG. 2B is a conceptual view illustrating a configuration in which the door is secondarily rotated in the configuration illustrated in FIG. 2A.

In order to ensure that the door 10 does not interfere with the body 20 when the door 10 is opened as described above, the hinge unit 30 may have a double hinge structure having two different rotating shafts. As illustrated in FIGS. 2A and 2B, the hinge unit 30 may be configured such that the door 10 is separated from the door accommodation portion 20b by primary rotation about any one rotating shaft, and then the body 20 is rotated by secondary rotation about another rotating shaft.

When the hinge unit 30 is mounted at a first side of the door 10, a locking device to fix or release the door 10 to or from the body 20 may be provided at a second side of the door 10. The locking device may be configured as a press type, and configured to lock the door 10 when the second side of the door 10 is pressed once and release the door 10 when the second side of the door 10 is pressed once again.

The door 10 may include a window unit (or window) 11 and a display unit (or display) 12. When the door 10 is closed, the window unit 11 may correspond to the laundry inlet 20a, and may be configured to view the laundry accommodation portion. Accordingly, the user may check the status of laundry accommodated in the laundry accommodation portion through the window unit 11.

The display unit 12 may displays (outputs) information processed by the laundry treating apparatus 1. The display unit 12 may display the execution screen information of cycles (washing, dehydration, drying cycles, etc.) driven by the laundry treating apparatus 1 or user interface (UI), graphic user interface (GUI) information corresponding to the execution screen information.

Figure 3:
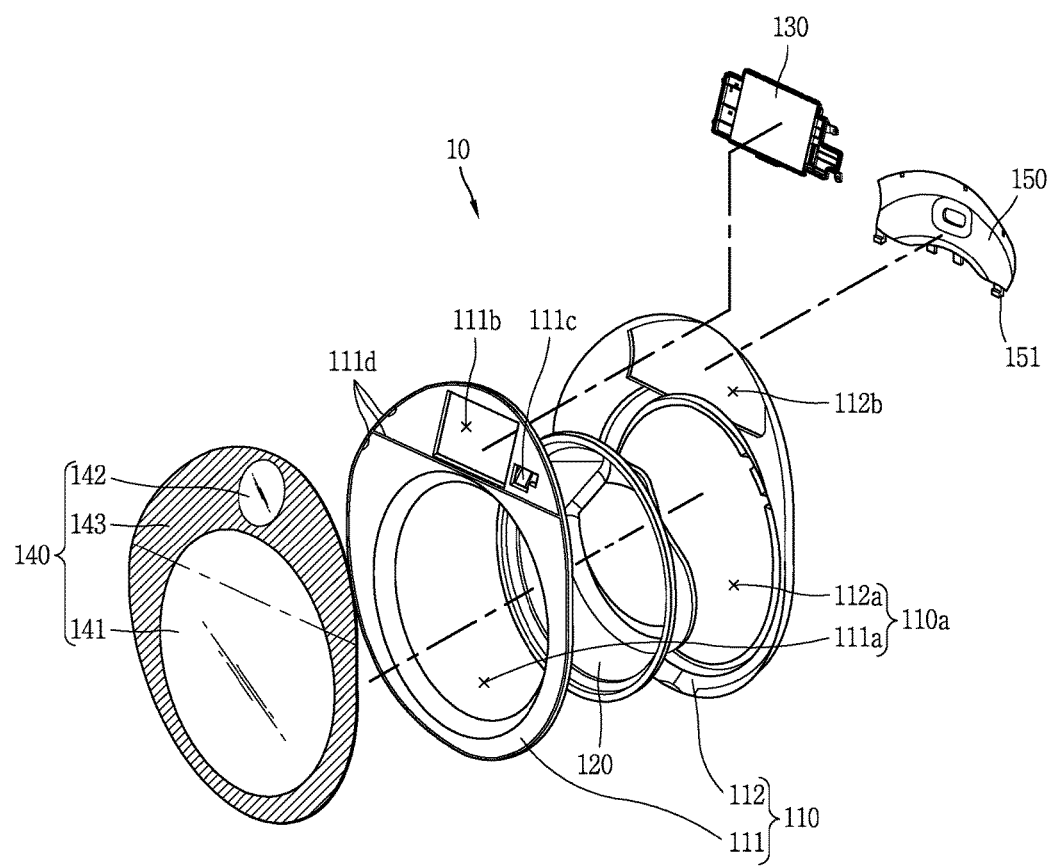
FIG. 3 is an exploded perspective view of the door illustrated in FIG. 1.

Referring to FIGS. 3 and 4, the door 10 may include a door frame 110, a door window 120, a display module 130 and a door cover 140. As described above, the hinge unit 30 for coupling to the body 20 may be mounted on the door 10, but the hinge unit 30 is omitted on the present drawing.

The door 10 may be formed in a circular shape (including a right circular shape, an elliptical shape, or a round shape at least part of which is formed in a round manner). However, the present disclosure may not be necessarily limited to this. The door 10 may be formed in a polygonal shape (rectangular shape, hexagonal shape, etc.). The door frame 110 may be rotatably coupled to the body 20, and to this end, the hinge unit 30 may be coupled to the door frame 110 and body 20, respectively.

The door frame 110 may include an outer frame 111 and an inner frame 112. The outer frame 111 and inner frame 112 may be formed of a synthetic resin material (for example, ABS material, PC material, etc.).

The outer frame 111 may face an outside of the body 20, and the inner frame 112 may face an inside of the body 20 when viewing the door frame 110 itself when the door 10 is closed. The outer frame 111 and inner frame 112 may be also referred to as a first and a second frame, respectively.

The door frame 110 may include a first opening portion 110a facing the laundry inlet 20a when the door 10 is closed and a second opening portion 111b corresponding to the display module 130 mounted in the door frame 110. The first opening portion 110a may also be referred to as a door window hole in the aspect that the door window 120 is installed at the first opening portion 110a, and the second opening portion 111b may also be referred to as a display hole in the aspect that the display module 130 is mounted at the second opening portion 111b. The second opening portion 111b may be located on the first opening portion 110a.

The first opening portion 110a may include a front side opening portion 111a formed on the outer frame 111 and a rear side opening portion 112a formed on the inner frame 112. The second opening portion 111b may be formed on the outer frame 111. A communication portion 112b may be formed on the rear side opening portion 112a of the inner frame 112, and the display module 130 may be mounted within the door frame 110 through the communication portion 112b.

The door frame 110 may be installed on the door window 120 to correspond to the first opening portion 110a. The door window 120 may be formed of a light transmitting material (glass, synthetic resin material, etc.), and arranged to correspond to the laundry inlet 20a when the door 10 is closed.

The display module 130 may be installed within the door frame 110. The display module 130 may be provided to correspond to the second opening portion 111b, and a display 132 provided in the display module 130 may be configured to display visual information associated with information processed in the laundry treating apparatus 1.

A FPCB hole 111c through which a flexible printed circuit board (FPCB) of the touch sensor 160 may pass may be provided on the door frame 110. The FPCB hole 111c may be provided at one side of the second opening portion 111b.

The door cover 140 forming an appearance of the door 10 may be coupled to the door frame 110. The door cover 140 may be formed of a glass material or synthetic resin material having light transmitting characteristics.

The door cover 140 may include a non-light-transmitting region 143, a first light transmitting region 141 corresponding to the first opening portion 110a, and a second light transmitting region 142 corresponding to the second opening portion 111b. The light transmitting region (or transparent region) denotes a region configured to pass at least part of light through which an opposite side thereof or inside thereof is seen.

The first and the second light transmitting region 141, 142 may be partitioned from each other by the non-light-transmitting region 143. The door frame 110 and door cover 140 may be circular to be connected to the door 10 having a circular shape, and the first and the second light transmitting region 141, 142 may be circular to give an integrated aesthetic sense to the user.

At least part of the door cover 140 may have a bent shape. A first cover portion and a second cover portion at either side of the bending portion may each be formed in an inclined manner with respect to each other by the bent bending portion. Here, the first cover portion and second cover portion may be formed in a flat shape. The door frame 110 may also be formed in such a manner that at least part thereof is bent to correspond to the door cover 140.

The first light transmitting region 141 may be formed across the first cover portion and bending portion, and the second light transmitting region 142 may be formed on the second cover portion. The second light transmitting region 142 may be smaller than the second opening portion 111b, and may overlap within the second opening portion 111b when the door cover 140 is coupled to the door frame 110.

The second opening portion 111b may be formed in a rectangular shape corresponding to the display module 130 having a rectangular shape, and the second light transmitting region 142 may be formed in a circular shape to overlap within the second opening portion 111b. In other words, the second light transmitting region 142 may overlap with part of the display module 130, and the non-light-transmitting region 143 may cover and hide another part of the display module 130. Visual information may thus be displayed only on a portion corresponding to the second light transmitting region 142 having a circular shape to provide the display unit 12 having a circular shape to the user.

The cost of a circular display may be higher than the cost of a rectangular display 132 that is typically and widely used, and its assembly failure may frequently occur due to difficulties in getting an accurate installation position due to its circular shape. However, according to the foregoing structure, it may be possible to provide a display unit 12 that is seen as a circular shape for the user while using the rectangular display 132 with a lower cost that can be assembled accurately.

The second light transmitting region 142 may be surrounded by the non-light-transmitting region 143, and thus visual information displayed on a portion of the display 132 that does not correspond to the second light transmitting region 142 within the display 132 may not be seen by the user. Taking this into account, visual information may not be displayed on a portion that does not correspond to the second light transmitting region 142 within the display 132.

An edge image surrounding the visual information may be displayed on a portion that does not correspond to the second light transmitting region 142 when visual information associated with information processed in the laundry treating apparatus 1 is displayed on a portion of the display 132 corresponding to the second light transmitting region 142. The edge image as a portion that does not correspond to the second light transmitting region 142 may be filled with a specific series of colors (for example, black).

Alternatively, a portion of the display 132 that does not correspond to the second light transmitting region 142 may be off in a state that visual information associated with information processed in the laundry treating apparatus 1 is displayed on a portion corresponding to the second light transmitting region 142. In other words, an edge image as well as visual information may not be displayed on a portion of the display 132 that does not correspond to the second light transmitting region 142 within the display module 130. Only part of the display 132 may be operated to allow efficient operation of the display 132 compared to the foregoing example in which the whole display 132 is operated, thereby obtaining an energy saving effect.

The display unit 12 formed on the door cover 140 may form an interlayer or integrated structure with the touch sensor 160 to implement the touch screen 12. The touch screen 12 may provide an output interface between the laundry treating apparatus 1 and the user while at the same time functioning as a user input unit or screen providing an input interface between the laundry treating apparatus 1 and the user. The selection and change of an operation mode for performing washing, dehydration, drying cycles, and the like may be implemented by the user's touch input (or touch).

The touch sensor 160 may be provided at the door 10 to sense a touch input to the door cover 140. The touch sensor 160 may sense a touch input applied to the display unit (or touch screen) 12 using at least one of various touch methods, such as a resistive method, a capacitive method, an infrared method, an ultrasonic method, a magnetic method, and the like.

The touch sensor 160 may be configured to convert a change such as a pressure applied to a specific portion of the touch screen 12 or a capacitance generated at a specific portion or the like into an electrical input signal. The touch sensor 160 may be configured to detect a position, an area, or a pressure during touch or the like at which an object applying a touch to the display unit 12 is touched on the touch sensor 160. Here, the object may include a finger, a touch pen or stylus pen, a pointer, or the like.

When there is a touch input to the touch sensor 160 as described above, signal(s) corresponding to the area touched may be sent to the controller. The controller may process the signal(s) and then transmit the corresponding data to the controller. As a result, the controller may know which region of the display unit 12 has been touched. Here, the controller may be an additional configuration to the controller or the controller itself.

The controller may perform a different control operation according to the type of a touch object touching the display unit 12 or perform the same control operation. Whether to perform a different control operation or perform the same control operation according to the type of the touch object may be determined by the operation status of the laundry treating apparatus 1 or an application program being executed. The touch sensor 160 may sense various types of touches such as a short or tap touch, a long touch, a multi touch, a drag touch, a flick touch, a pinch-in touch, a pinch-out touch, a swype touch, a hovering touch, and the like.

The touch sensor 160 may be configured to sense a touch input to a sensing region including the second light transmitting region 142.

The touch sensor 160 may be adhered to a rear surface of the door cover 140 to cover the second light transmitting region 142 and part of the non-light-transmitting region 143 surrounding the second light transmitting region 142. According to the foregoing configuration, the sensing region of the touch sensor 160 may include part of the non-light-transmitting region 143 surrounding the second light transmitting region 142 as well as the second light transmitting region 142. Accordingly, it may be possible to provide various UIs or GUIs using part of the non-light-transmitting region 143 surrounding the second light transmitting region 142.

According to the foregoing structure, the touch sensor 160 may be formed as a touch film type having a touch pattern, and provided between the door cover 140 and the display module 130. The touch film may be configured with a transparent conductive film, and previously known films such as an indium tin oxide (ITO) film, a carbon nano tube (CNT) film, or the like may be used for the touch film.

The touch film may be configured with a single or double layer. When the touch film is a glass-film-film (GFF) configured with a double layer, the touch film may be adhered to a rear surface of the door cover 140 or adhered to the display module 130. When the touch film is a glass-film (G1F) configured with a single layer, the touch film may be adhered to a rear surface of the door cover 140 and integrally formed with the door cover 140.

The touch sensor 160 may be formed in such a manner that a metal wire is directly patterned on a rear surface of the door cover 140 without an additional touch film [Glass only (G2)]. Alternatively, the touch sensor 160 may be integrally formed with the display 132 provided in the display module 130. For example, the touch sensor 160 may be provided on a substrate of the display 132 (on-cell) or provided within the display 132 (in-cell).

The operation of the display unit 12 of the laundry treating apparatus 1 may be controlled by the controller. In other words, the controller 180 may control the on/off of the display module 130, and the display of visual information or image, and may control the on/off of the touch sensor 160.

The controller may be configured to control whether to activate touch sensing to a region of the display unit 12 that does not correspond to the second light transmitting region 142 within a sensing region of the touch sensor 160. The controller may be configured to distinguish a state in which touch sensing for a region that does not correspond to the second light transmitting region 142 within the sensing region of the touch sensor 160 is required, from a state in which the touch sensing is not required to deactivate the touch sensing for the non-corresponding region in the state that the touch sensing is not required. According to the control, it may be possible to reduce an error during the user's touch input and obtain an energy saving effect.

Figure 6:
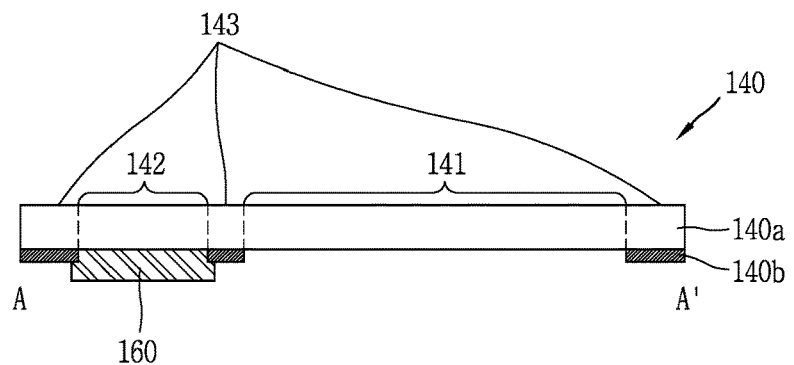
FIG. 6 is a cross-sectional view illustrating a first embodiment of the door cover taken along line A-A' illustrated in FIG. 5.

Referring to FIG. 6, the door cover 140 may include a cover body 140a and a shield layer 140b. The cover body 140a may be formed of a light transmitting material. The cover body 140a may be formed of a light transmitting glass material or synthetic resin material. At least part of the cover body 140a may be bent.

The shield layer 140b may cover one surface of the cover body 140a to form the non-light-transmitting region 143. The shield layer 140b may be formed on a front surface or rear surface of the cover body 140a.

Ink may be printed on a rear surface of the cover body 140a to form the shield layer 140b. The ink may include a pigment having a specific series of colors (for example, black).

The shield layer 140b may not be provided in the first and the second light transmitting regions 141, 142. The first and the second light transmitting regions 141, 142 may be transparent portions remaining as a light transmitting cover body 140a without being covered by the shield layer 140b. The touch sensor 160 may be adhered to a rear surface of the cover body 140a corresponding to the second light transmitting region 142, and here, the touch sensor 160 may cover part of the shield layer 140b to restrict the second light transmitting region 142.

Figure 7:
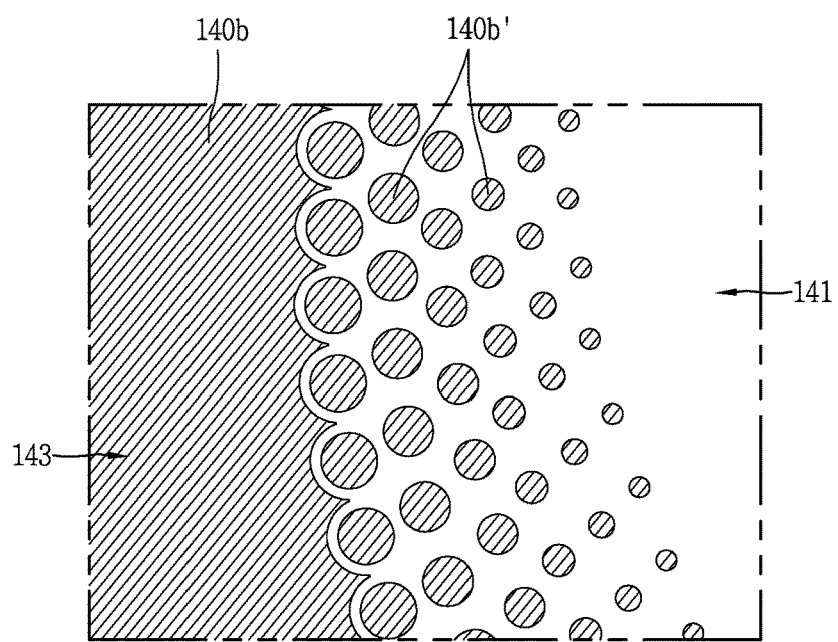
FIG. 7 is an enlarged view of a portion "B" illustrated in FIG. 5.
Figure 8:
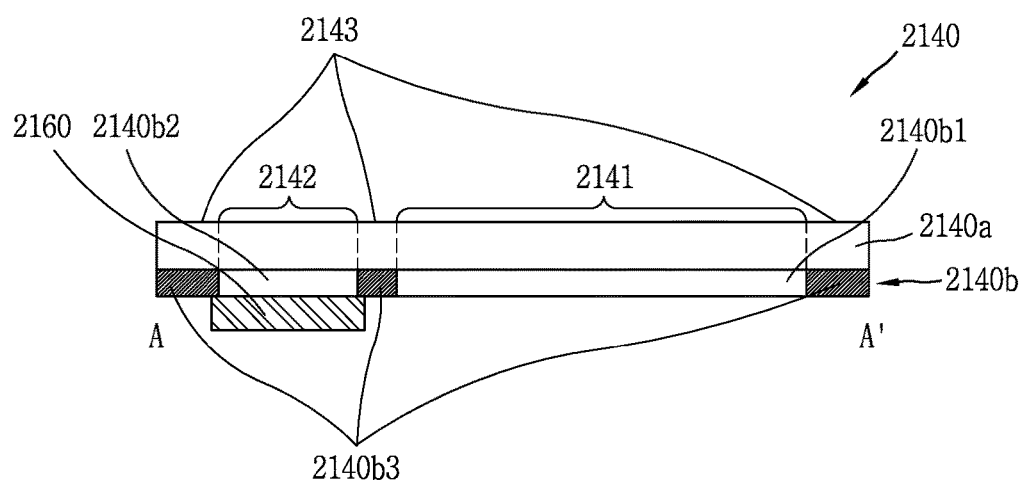
FIG. 8 is a cross-sectional view illustrating a second embodiment of the door cover taken along line A-A' illustrated in FIG. 5.

Referring to FIG. 7, the transparency of the shield layer 140b to restrict the first light transmitting region 141 within the door cover 140 may be formed to gradually vary as being located closer to the first light transmitting region 141. The non-light-transmitting region 143 adjacent to the first light transmitting region 141 may gradually become more transparent in a direction toward the first light transmitting region 141. The shield layer 140b may include a plurality of shield dots 140b' formed adjacent to the first light transmitting region 141, and the density of the plurality of shield dots 140b' may decrease in a direction toward the first light transmitting region 141.

By blurring a boundary to the first light transmitting region 141 through such a halftone technique, the non-light-transmitting region 143 may visually and naturally change to the first light transmitting region 141. The touch sensor 2160 may be adhered to a rear surface of the film 2140b corresponding to the second light transmitting portion 2140b2, and here, the touch sensor 2160 may cover part of the non-light-transmitting portion 2140b3 to restrict the second light transmitting portion 2140b2.

Figure 9:
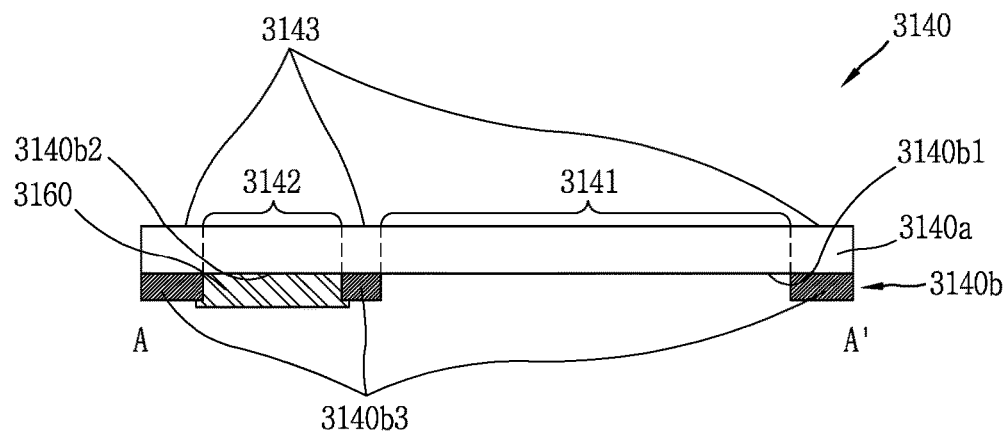
FIG. 9 is a cross-sectional view illustrating a third embodiment of the door cover taken along line A-A' illustrated in FIG. 5.

A film 3140b that forms a shield layer 3140b may be adhered to a rear surface of the cover body 3140a. As illustrated in FIG. 9, the film 3140b may include a non-light-transmitting portion 3140b3 corresponding to the non-light-transmitting region 3143, a first hole 3140b1 corresponding to a first light transmitting region 3141 and a second hole 3140b2 corresponding to a second light transmitting region 3142. The non-light-transmitting portion 3140b3 may surround the first and second holes 3140b1, 3140b2, and the first and second holes 3140b1, 3140b2 may be partitioned from each other by the non-light-transmitting portion 3140b3.

A portion of the film 3140b corresponding to the non-light-transmitting portion 3140b3 may function as a shield layer to allow the door cover 3140 to be non-transparent to form the non-light-transmitting region 3143. The first and second holes 3140b1, 3140b2 may be formed on a portion of the film 3140*b* corresponding to the first and the second light transmitting regions 3141, 3142. Thus, the film 3140*b* may not be provided on the first and second light transmitting regions 3141, 3142.

The touch sensor 3160 may be adhered to a rear surface of the film 3140*b* corresponding to the second light transmitting region 3142, and here, the touch sensor 3160 may cover part of the non-light-transmitting portion 3140*b*3 to restrict the second light hole 3140*b*2.

Figure 10:
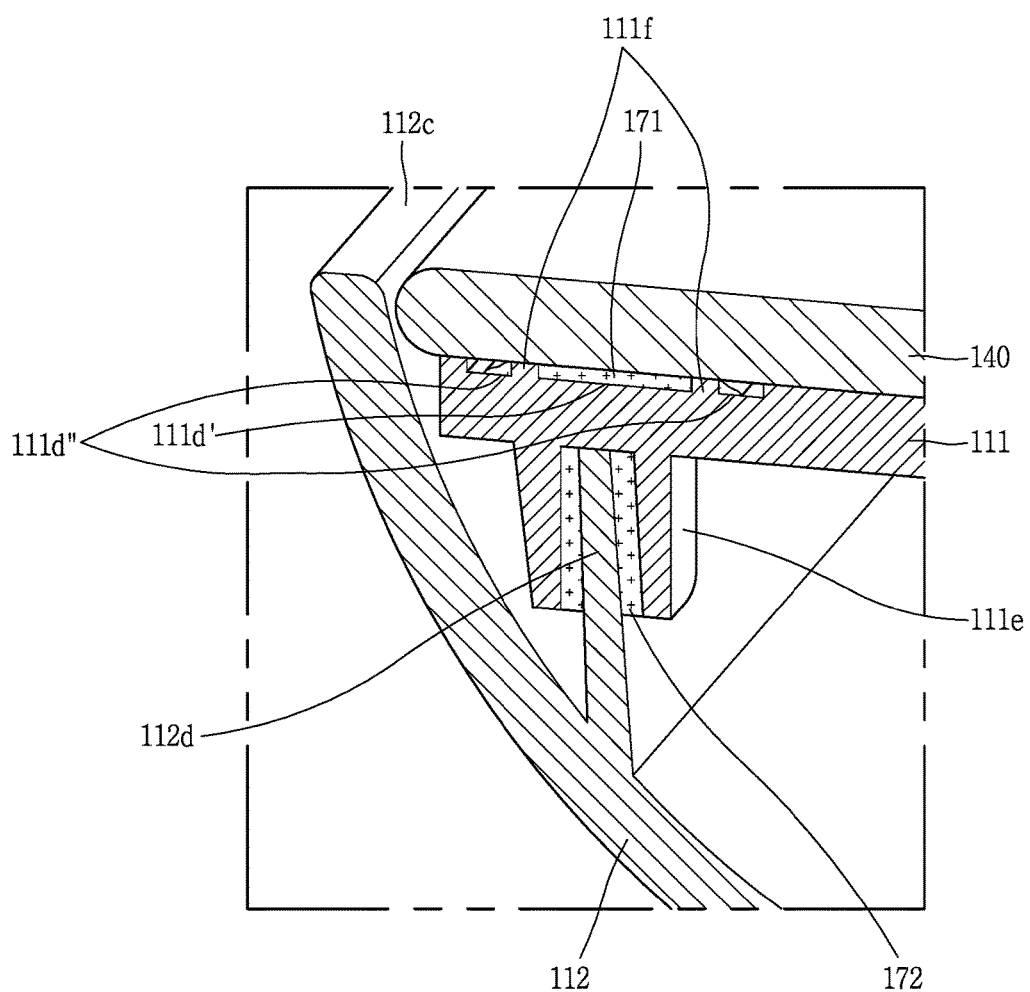
FIG. 10 is a cross-sectional view taken along line C-C' illustrated in FIG. 4.

Referring to FIG. 10, the door cover 140 may be coupled to the door frame 110 using a liquid phase sealant 171. A coupling structure between the door cover 140 and the door frame 110 will be described in detail later. The door frame 110 may include an outer frame 111 and an inner frame 112.

The door cover 140 may be adhered to a front surface of the outer frame 111. The inner frame 112 may be coupled to a rear side of the outer frame 111. The outer frame 111 and the inner frame 112 may be coupled by a screw coupling, a hook coupling, a bonding coupling, or the like.

The outer frame 111 and the inner frame 112*a* may be coupled to each other by a bonding coupling. Specifically, a fastening rib 112*d* may be formed in a protruding manner on the inner frame 112, and a rib accommodation portion 111*e* to accommodate the fastening rib 112*d* may be formed in a protruding manner on a rear surface of the outer frame 111, and a bonding member 172 may be filled into the rib accommodation portion 111*e*.

During coupling between the outer frame 111 and the inner frame 112, an outer circumferential portion of the inner frame 112 may be formed in a protruding manner on a front surface of the outer frame 111 to form a mounting guide 112*c*. The mounting guide 112*c* is extended in a loop shape along a circumference of the outer frame 111 to form a space that accommodates the door cover 140 therein.

The mounting guide 112*c* may cover a lateral surface of the door cover 140, and an upper surface of the mounting guide 112*c* may be formed in a protruding manner at a predetermined height to be coplanar with an upper surface of the adjoining door cover 140. According to the foregoing configuration, a step between the mounting guide 112*c* and the door cover 140 may be decreased to implement a simpler design.

In general, a portion (for example, a vertex portion, a concave portion, etc.) having a unique shape may be a reference point capable of adjusting an installation position during assembly, thereby facilitating the assembly. However, when the door cover 140 is formed in a circular shape, an apex portion has a round shape, and a portion capable of adjusting an installation position during assembly may be unsuitable. In particular, unless the door cover 140 is coupled to an accurate position on the door frame 110, the first and the second light transmitting region 141, 142 of the door cover 140 may not correspond to the first and the second opening portion 110*a*, 111*b* of the door frame 110.

Figure 11:
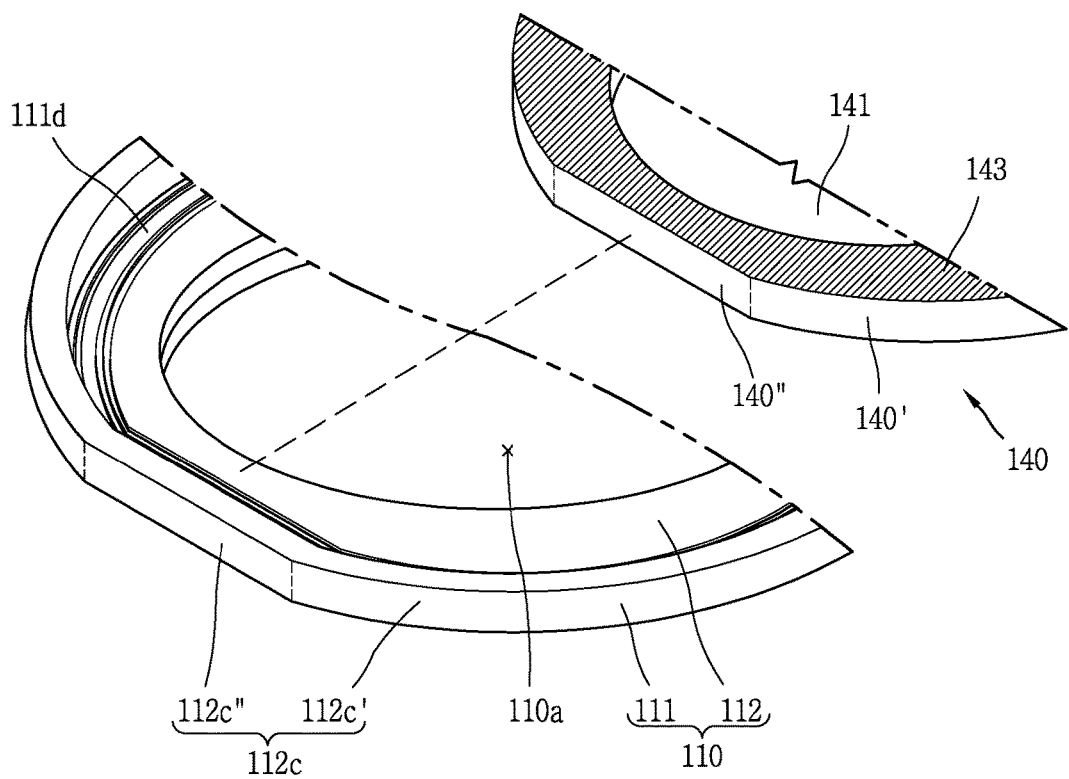
FIG. 11 is a conceptual view in which the door cover and a door frame are shown in a separate manner on a portion "D" illustrated in FIG. 4.
Figure 12:
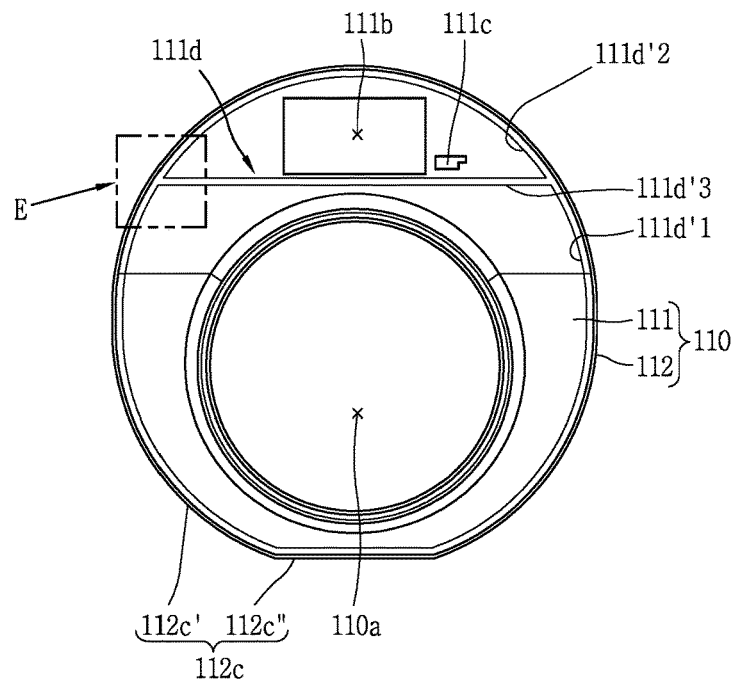
FIG. 12 is a front view illustrating a first embodiment of the door frame illustrated in FIG. 3.
Figure 13:
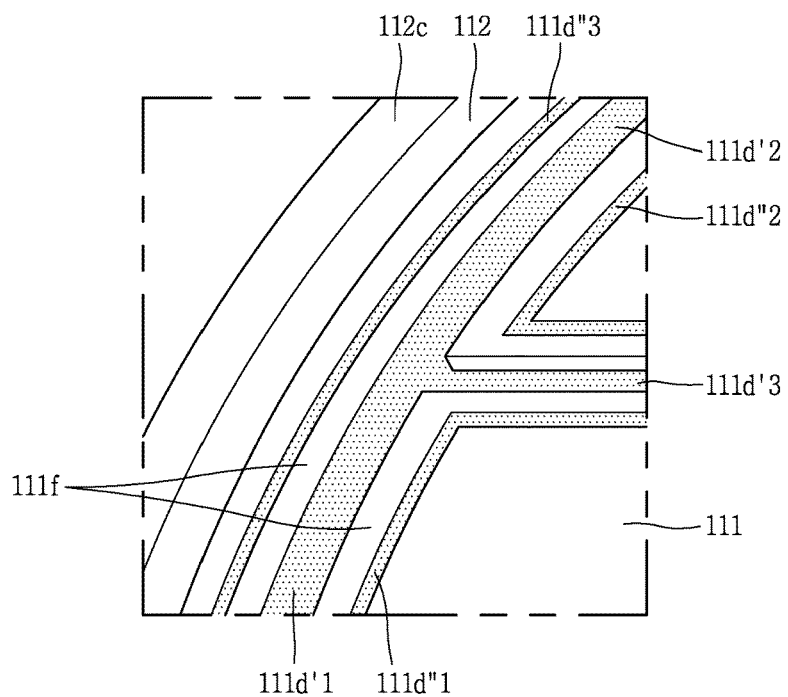
FIG. 13 is an enlarged view of a portion "E" illustrated in FIG. 12.

As illustrated in FIG. 11, the door cover 140 may include a portion that will be a reference point capable of adjusting an installation position while being assembled to the door frame 110. The door cover 140 may include a first edge portion 140' formed in a round manner and a second edge portion 140" that connects both sides of the first edge portion 140'. The door cover 140 may have a circular shape with a portion cut in a linear form. The second edge portion 140" may have any form that is distinguishable in shape from the first edge portion 140' such as a linear form, a rugged form, or the like.

The foregoing mounting guide 112*c* may include a first protrusion portion 112*c*' extended in a round manner to correspond to the first edge portion 140' and a second protrusion portion 112*c*" extended in a linear shape to correspond to the second edge portion 140". The second edge portion 140" and second protrusion portion 112*c*" may be a reference point capable of adjusting an installation position during assembly between the door cover 140 and the door frame 110.

When the second edge portion 140" corresponds to the second protrusion portion 112*c*", the door cover 140 may be located at a normal position on the door frame 110, and thus the first and the second light transmitting regions 141, 142 of the door cover 140 may correspond to the first and the second opening portions 110*a*, 111*b* of the door frame 110. The second protrusion portion 112*c*" may be located at any position of the door frame 110, but the second protrusion portion 112*c*" may be preferably formed at a lower side of the door frame 110.

Hereinafter, a coupling structure between the door cover 140 and the door frame 110 will be described. The door 10 may be coupled to a front surface of the outer frame 111 using a sealant 171, and a sealant filling groove 111*d* into which the sealant 171 is filled may be formed on a front surface of the outer frame 111.

The sealant filling groove 111*d* may surround the first opening portion 110*a* and second opening portion 111*b*, respectively. The sealant filling groove 111*d* may include a connecting groove portion 111*d*'3, a first groove portion 111*d*'1 and a second groove portion 111*d*'2.

The connecting groove portion 111*d*'3 may cross between the first and the second opening portion 110*a*, 111*b*. The connecting groove portion 111*d*'3 may be formed in a linear shape or a bent shape on at least one portion thereof (for example, in a U-shape surrounding both sides and a lower side of the second opening portion 111*b*) as illustrated in the drawing.

The first groove portion 111*d*'1 may be connected to both end portions of the connecting groove portion 111*d*'3, and formed to surround a circumference of the first opening portion 110*a* along with the connecting groove portion 111*d*'3. The first groove portion 111*d*'1 may be extended along an inner circumference of the outer frame 111.

The second groove portion 111*d*'2 may be connected to both end portions of the connecting groove portion 111*d*'3, and formed to surround a circumference of the second opening portion 111*b* along with the connecting groove portion 111*d*'3. The second groove portion 111*d*'2 may be extended along an inner circumference of the outer frame 111.

The first groove portion 111*d*'1 and the second groove portion 111*d*'2 may communicate with each other at both end portions of the connecting groove portion 111*d*'3. The first and the second groove portion 111*d*'2 may extend along an inner circumference of the outer frame 111 to form a circular groove, and the connecting groove portion 111*d*'3 may extend in a linear shape to cross an inside of the circular groove.

The sealant filling groove 111*d* may include a sealant coating portion 111*d*' and a sealant collecting portion 111*d*". The sealant coating portion 111*d*' as a portion for the filling of the sealant 171 may include the foregoing connecting groove portion 111*d*'3, first groove portion 111*d*'1 and second groove portion 111*d*'2.

The sealant collecting portion 111*d*" may collect the sealant 171 leaked out of an inner and an outer side of the sealant coating portion 111*d*', respectively, and may be provided at both sides of the sealant coating portion 111*d*'. The sealant collecting portion 111*d*" may be extended in parallel along the sealant coating portion 111d' while spaced apart from the sealant coating portion 111d' by interposing a predetermined distance therebetween. The sealant collecting portion 111d" may have a smaller width than that of the sealant coating portion 111d'.

A projection 111f may protrude to a predetermined height between the sealant coating portion 111d' and the sealant collecting portion 111d". The projection 111f may protrude to a height corresponding to a front surface of the outer frame 111, and the projection 111f may function as a supporting surface that supports the door cover 140.

The sealant collecting portion 111d" may include a first through a third sealant collecting portion 111d"1, 111d"2, 111d"3. The first sealant collecting portion 111d"1 may be provided at an inner side of the sealant coating portion 111d', and formed to surround the first opening portion 110a. The first sealant collecting portion 111d"1 may extend along the connecting groove portion 111d'3 and the first groove portion 111d'1.

The second sealant collecting portion 111d"2 may be provided at an inner side of the sealant coating portion 111d', and formed to surround the second opening portion 111b. The second sealant collecting portion 111d"2 may extend along the connecting groove portion 111d'3 and the second groove portion 111d'2.

The third sealant collecting portion 111d"3 may be provided at an outer side of the sealant coating portion 111d', and formed to surround the sealant collecting portion 111d'. The third sealant collecting portion 111d"3 may extend along the first groove portion 111d'1 and the second groove portion 111d'2, and may have a circular shape.

According to the foregoing configuration, even if the sealant 171 filled into the sealant coating portion 111d' leaks out during the process of coupling the door cover 140 to the outer frame 111, the sealant 171 leaked out to the sealant collecting portion 111d" may be collected. As a result, it may be possible to prevent the deterioration of appearance quality due to the leakage of the sealant 171.

The sealant coating portion 111d' may be adjacent to an edge portion of the outer frame 111. Accordingly, it may be possible to minimize a non-joint portion on an edge portion of the corresponding door cover 140, thereby enhancing the joint strength, and effectively preventing foreign substances from being infiltrated through a gap between the door cover 140 and the outer frame 111.

Figure 14:
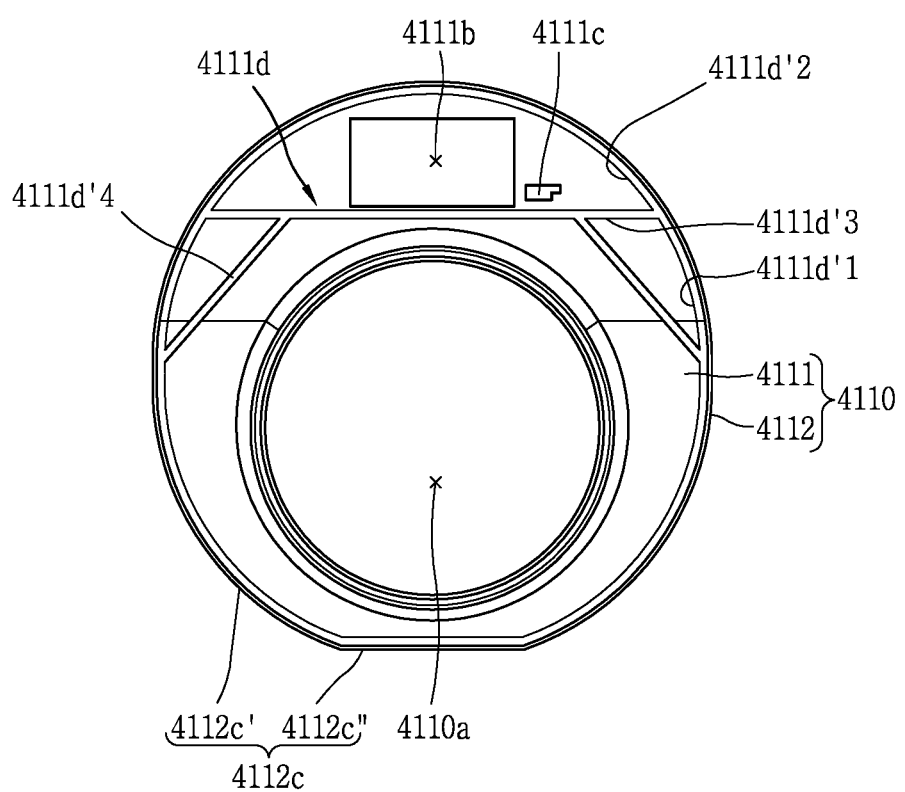
FIG. 14 is a front view illustrating a second embodiment of the door frame illustrated in FIG. 3.
Figure 15:
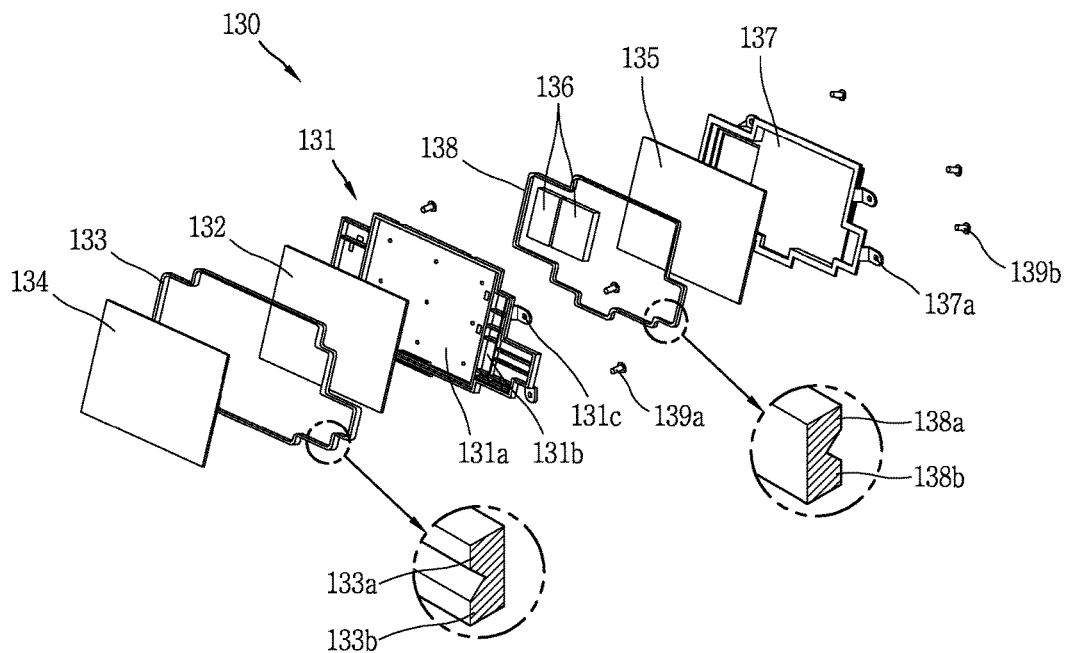
FIGS. 15 and 16 are exploded perspective views in which a display module illustrated in FIG. 3 is seen from different directions.
Figure 16:
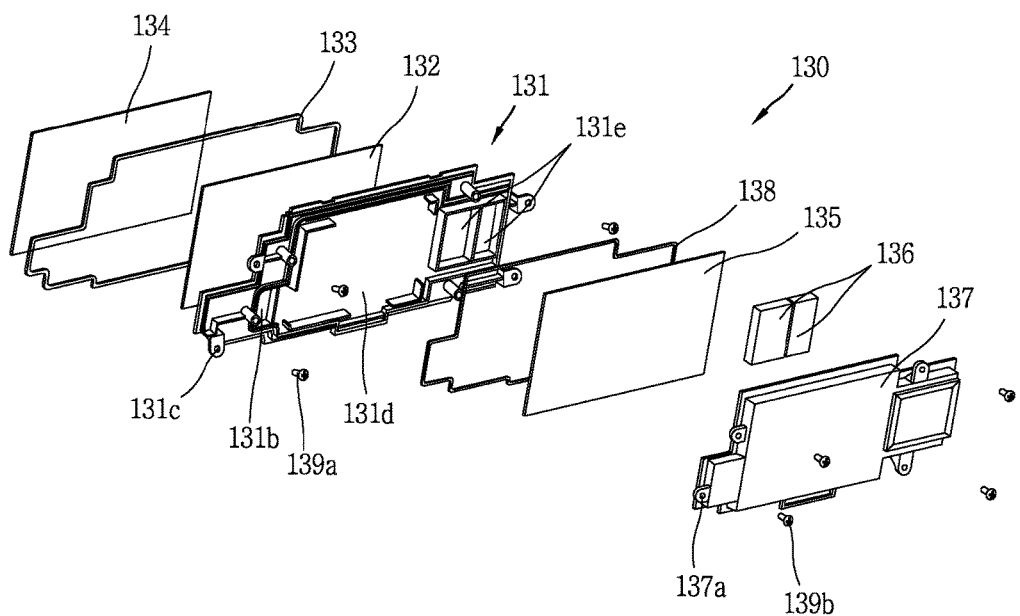
Figure 17:
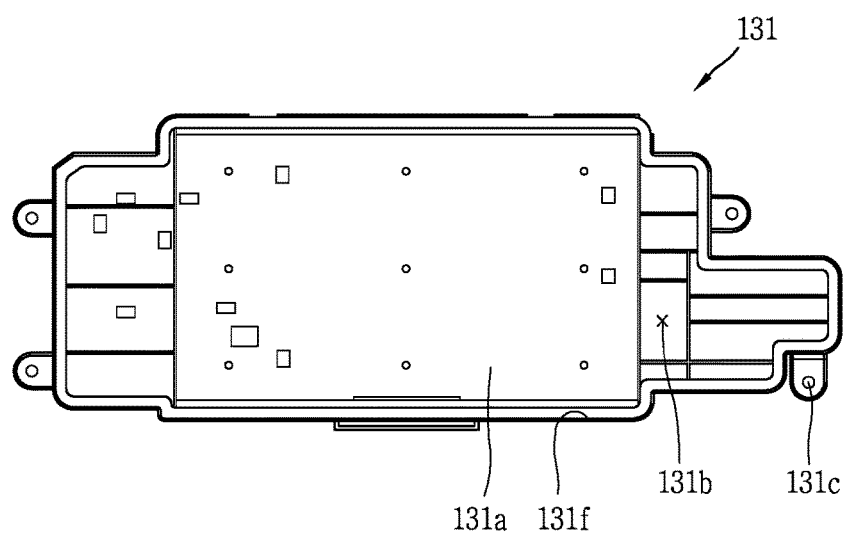
FIG. 17 is a front view of a mounting frame illustrated in FIG. 15.
Figure 18:
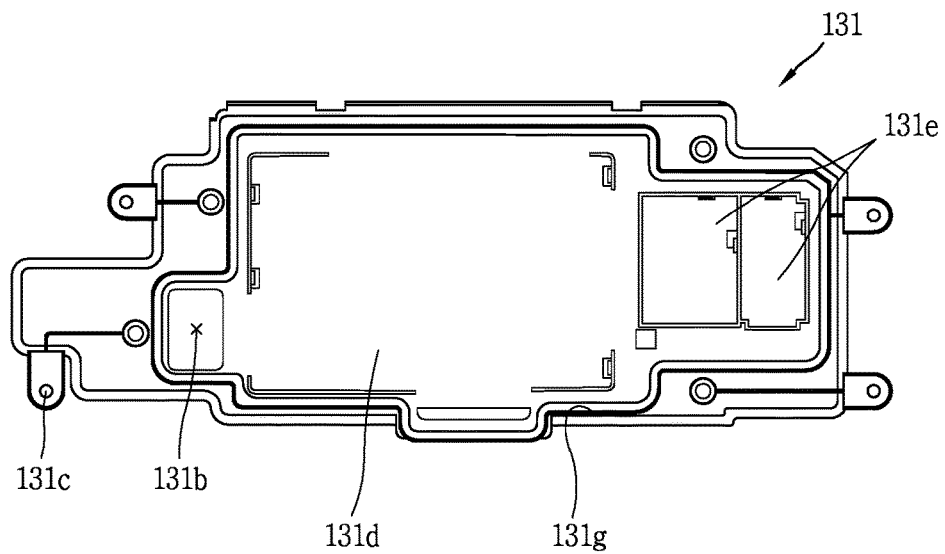
FIG. 18 is a rear view of the mounting frame illustrated in FIG. 15.
Figure 19:
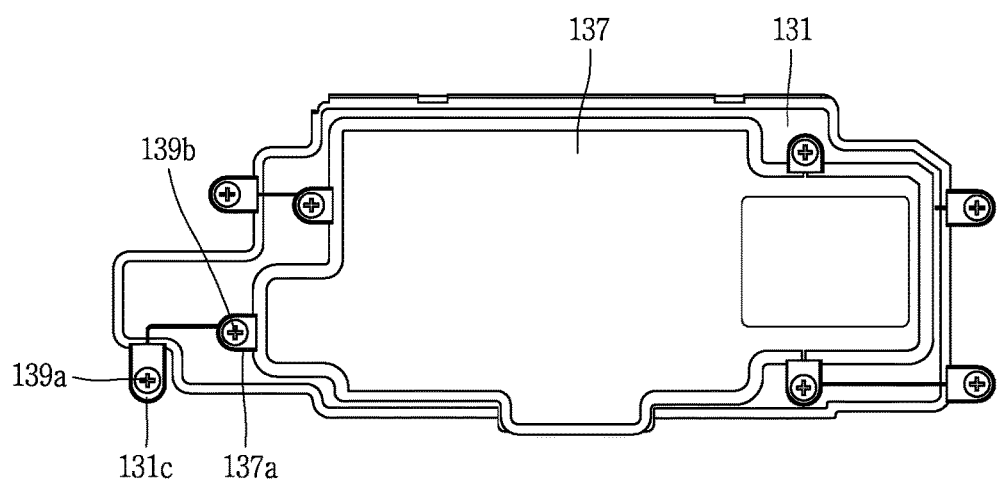
FIG. 19 is a rear view illustrating a configuration in which a PCB cover is coupled to a mounting frame illustrated in FIG. 15.

Referring to FIG. 14, a sealant filling groove 4111d may include a connecting groove portion 4111d'3, a first groove portion 4111d'1 and a second groove portion 4111d'2, and may surround a first and a second opening portion 4110a, 4111b, respectively. The sealant filling groove 4111d may include a sealant coating portion and a sealant collecting portion, and the description thereof will be the same as that of the foregoing first embodiment.

The sealant filling groove 4111d may further include a bypass groove portion 4111d'4 to connect between an arbitrary point on the connecting groove portion 4111d'3 and an arbitrary point on the first groove portion 4111d'1. The bypass groove portion 4111d'4 may be located within a space formed by the connecting groove portion 4111d'3 and the first groove portion 4111d'1.

As a result, part of the sealant filled into the connecting groove portion 4111d'3 or first groove portion 4111d'1 may be introduced into the branched bypass groove portion 4111d'4, thereby increasing a number of couplings between the door cover and the door frame 4110. Accordingly, it may be possible to increase a coupling force between the door cover and the door frame 4110.

The bypass groove portion 4111d'4 may include a sealant coating portion for the filling of sealant, and a sealant collecting portion provided at both sides of the sealant coating portion to collect sealant leaked out of an inner and an outer side of the sealant coating portion, respectively. The display module 130 may be integrated into the door frame 110, and because the door 10 opens and closes the laundry inlet 20a, moisture may leak into the display module 130. Accordingly, the sealing of the display module 130 may be a key point in the aspect of securing the reliability of driving the display unit 12.

Hereinafter, a sealing structure of the display module 130 will be described. Referring to FIGS. 15 through 19, the display module 130 may include a mounting frame 131, a display 132 and a display sealing member (or display gasket) 133.

The mounting frame 131 may include a display mounting portion 131a in which the display 132 is mounted on one surface thereof. The display mounting portion 131a may include a space recessed on a front surface of the mounting frame 131 toward a rear surface of the mounting frame 131 in a shape corresponding to the display 132 or an internal space restricted by a rib formed in a protruding manner to correspond to a circumference of the display 132. The mounting frame 131 may be formed of a synthetic resin material (for example, ABS material, PC material, etc.).

A communication hole 131b may be formed on the mounting frame 131. The communication hole 131b may be provided at one side of the display mounting portion 131a, and may be a space distinguished from the display mounting portion 131a. A flexible printed circuit board 161 of the touch sensor 160 may be electrically connected to a printed circuit board 135 through the FPCB hole 111c formed on the door frame 110 and the communication hole 131b formed on the mounting frame 131. A flexible printed circuit board of the display 132 as well as the flexible printed circuit board 161 of the touch sensor 160 may pass through the communication hole 131b.

The display 132 may be mounted on the mounting frame 131 to display visual information. The display 132 may include at least one of a liquid crystal display (LCD), a thin film transistor-liquid crystal display (TFT LCD), an organic light-emitting display diode (OLED), a flexible display, a three-dimensional (3D) display, and an e-ink display.

For the display 132, a typically and widely used tetragonal display, more particular, a rectangular display 132 having different horizontal and vertical lengths may be used. As described above, the rectangular display 132 has a lower cost compared to a circular display, and has an advantage of facilitating an accurate mounting position while mounting on the mounting frame 131 due to a portion having a unique shape (having a vertex, different horizontal and vertical lengths).

When the display 132 is a rectangular shape, and the second light transmitting region 142 is a circular shape, the length of a shorter portion between the horizontal and vertical lengths may be larger than the diameter of the second light transmitting region 142 (a major axis of the second light transmitting region 142 when the second light transmitting region 142 is formed in an elliptical shape). When the above condition is satisfied, visual information may be displayed on the whole second light transmitting region 142.

Though the rectangular display 132 may be used for the display 132, a circular display unit 12 may be provided for the user. A circular second light transmitting region 142 configured to overlap with the display 132 may be formed on the door cover 140. Moreover, the controller may control the display of visual information on a portion of the display 132 that does not correspond to the second light transmitting region 142 within the display 132, thereby reducing power.

A display cover 134 formed of a light transmitting material, and covering the display 132 may be additionally provided on the display 132. The display cover 134 may cover and protect the display 132. The display cover 134 may be formed of a synthetic resin material (for example, acryl material, PET material, TPU material, etc.).

The display sealing member 133 may be provided between the door frame 110 and the mounting frame 131, and may surround the display 132. When the communication hole 131b is provided in the mounting frame 131, the display sealing member 133 may surround the display 132 at the same time to enhance the reliability of a watertight structure.

The display sealing member 133 may be fixed to the door frame 110 or fixed to the mounting frame 131. The display sealing member 133 may be fixed to the mounting frame 131 to seal an internal space when the mounting frame 131 is mounted on the door frame 110. An accommodation groove 131f to fix the display sealing member 133 may be formed on the mounting frame 131, and the accommodation groove 131f may be formed to surround the display 132. When the communication hole 131b is provided in the mounting frame 131, the accommodation groove 131f may be formed to surround the display 132 and the communication hole 131b at the same time to enhance the reliability of a watertight structure.

The display sealing member 133 may include a plurality of contact portions 133a, 133b. The contact portions 133a, 133b may be separated from each other in a width direction, and may extend in parallel along a length direction of the display sealing member to form a plurality of sealing loops. Accordingly, a sealing loop formed by either one of the contact portions 133a, 133b may be provided within a sealing loop formed by the other one of the contact portions 133a, 133b, thereby enhancing the reliability of the sealing structure.

The display module 130 may further include a printed circuit board (PCB) 135, a PCB cover 137, and a PCB sealing member (or PCB gasket) 138. The printed circuit board 135 may be electrically connected to the display 132, and mounted on the mounting frame 131. The display 132 may be mounted on a front surface of the mounting frame 131, and the printed circuit board 135 may be mounted on a rear surface of the mounting frame 131. When the touch sensor 160 is provided therein, the printed circuit board 135 may be electrically connected to the flexible printed circuit board 161 of the touch sensor 160 that passes through the communication hole 131b. The printed circuit board 135 may control the operation of the display 132 and touch sensor 160 or the controller itself.

A printed circuit board mounting portion 131d may be provided on a rear surface of the mounting frame 131 to mount the printed circuit board 135. The printed circuit board mounting portion 131d may be recessed on a rear surface of the mounting frame 131 toward a front surface of the mounting portion 131 in a shape corresponding to the printed circuit board 135 or an internal space restricted by a rib formed in a protruding manner to correspond to a circumference of the printed circuit board 135.

A wireless communication module 136 capable of performing wireless communication with an internal external device or external electronic device may be additionally mounted on the mounting frame 131. A wireless communication module mounting portion 131e in which to mount the wireless communication module 136 may be provided on the mounting frame 131, and the wireless communication module mounting portion 131e may be located at one side of the printed circuit board mounting portion 131d.

The wireless communication module 136 may include at least one of Wi-Fi, Bluetooth, and a communication module using RF. For example, the laundry treating apparatus 1 may perform wireless communication with the user's mobile terminal through a Wi-Fi communication module or Bluetooth communication module. The laundry treating apparatus 1 may also be configured to perform wireless communication with another home appliance (for example, another laundry treating apparatus 1 through the RF communication module.

The PCB cover 137 may be mounted on the mounting frame 131, and may cover the printed circuit board 135. The PCB cover 137 may be fastened to the mounting frame 131 by a screw coupling, a hook coupling, a bonding coupling, or the like. A mounting portion 137a formed with a mounting hole may be provided on the mounting frame 131, and a mounting member 139b may be screw-coupled to the mounting frame 131 through the mounting hole.

The door 10 may open and close the laundry inlet 20a, and because the display portion 12 may be provided in the door 10, there is a possibility to introduce moisture generated from the laundry inlet 20a into the printed circuit board 135. For reference, such a problem may not exist in a laundry treating apparatus in the related art in which the display portion is provided at an upper portion of the body.

Considering this, a PCB sealing member 138 may be provided between the mounting frame 131 and the PCB cover 137, and may seal a gap between the mounting frame 131 and the PCB cover 137. The PCB sealing member 138 may surround the printed circuit board 135, and may prevent moisture from leaking into the printed circuit board 135.

When the wireless communication module 136 is additionally provided therein, the PCB sealing member 138 may surround the printed circuit board 135 and wireless communication module 136 at the same time. Furthermore, when the communication hole 131b is provided on the mounting frame 131, the PCB sealing member 138 may surround the communication hole 131b at the same time to enhance the reliability of a watertight structure.

The PCB sealing member 138 may be fixed to the mounting frame 131 or fixed to the PCB cover 137. The PCB sealing member 138 may be fixed to the mounting frame 131, and configured to seal an internal space when the mounting frame 131 is coupled to the PCB cover 137.

To this end, a mounting groove 131g to fix the PCB sealing member 138 may be formed on the mounting frame 131, and the mounting groove 131g may surround the printed circuit board 135. As described above, the mounting groove 131g may surround the wireless communication module 136, the communication hole 131b, and the like, at the same time to enhance the reliability of a watertight structure.

The PCB sealing member 138 may be fixed to the mounting frame 131 or fixed to the PCB cover 137. The PCB sealing member 138 may be fixed to the mounting frame 131, and configured to seal an internal space when the mounting frame 131 is coupled to the PCB cover 137. A mounting groove 131g to fix the PCB sealing member 138 may be formed on the mounting frame 131, and the mounting groove 131g may surround the printed circuit board 135. If it has a structure in which the PCB sealing member 138 is fixed to the PCB cover 137, a mounting groove to fix the PCB sealing member 138 may be formed on the PCB cover 137.

The PCB sealing member 138 may include a plurality of contact portions 138a, 138b. The contact portions 138a, 138b may be separated from each other in a width direction, and may extend in parallel along a length direction of the PCB sealing member 138 to form a plurality of sealing loops. Accordingly, a sealing loop formed by either one of the contact portions 138a, 138b may be provided within a sealing loop formed by the other one of the contact portions 138a, 138b, thereby enhancing the reliability of the sealing structure.

Figure 20:
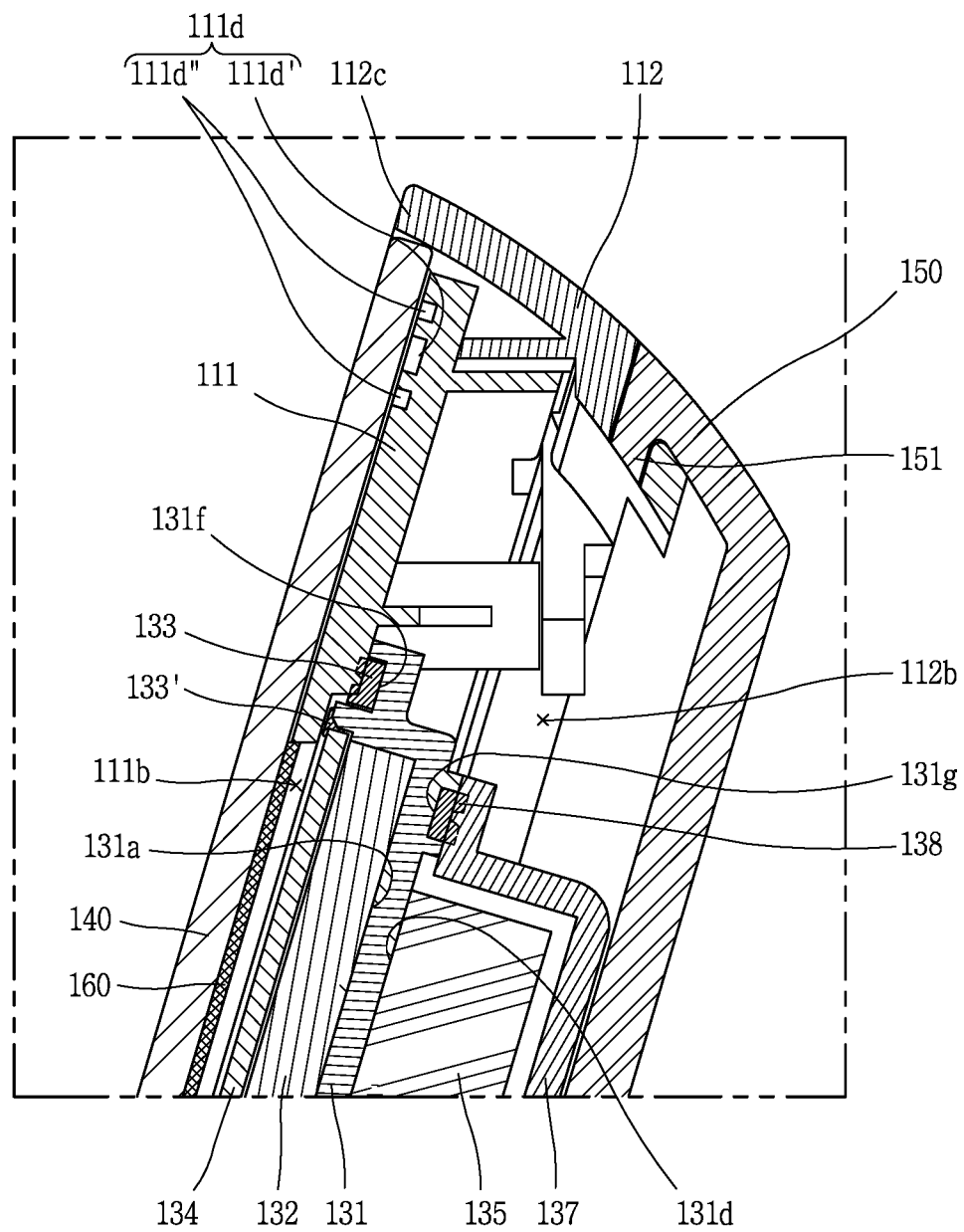
FIG. 20 is a cross-sectional view taken along line F-F' illustrated in FIG. 4.

Referring to FIG. 20, the display module 130 may be mounted on one side of the door frame 110 when the door cover 140 is mounted on the other side of the door frame 110. The mounting frame 131 may be fastened to the door frame 110 by a screw coupling, a hook coupling, a bonding coupling, or the like. A fastening portion 131c formed with a fastening hole may be provided on the mounting frame 131, and a fastening member 139a may be screw-coupled to the door frame 110 through the fastening hole.

When a door frame 110 includes an outer frame 111, an inner frame 112, and a frame cover 150, the door cover 140 may be mounted on a front surface of the outer frame 111, and the mounting frame 131 may be mounted on a rear surface of the outer frame 111 to correspond to the second opening portion 111b.

When the mounting frame 131 is mounted on a rear surface of the outer frame, it may be a structural advantage in that when the frame cover display portion 150 is separated and the display module 130 is exposed to a rear side of the door 10, the fastening member 139a fastened to the mounting frame 131 may be separated to completely take out the display module 130 to an outside. In other words, according to a structure in which the mounting frame 131 is mounted on a rear surface of the outer frame 111, repair work of the display module 130 may be easily carried out.

The display sealing member 133 may seal a gap between the mounting frame 131 and the outer frame 111 when the mounting frame 131 is mounted on the outer frame 111. The display sealing member 133 may be closely adhered to a mounting surface of the outer frame 111 adjacent to the second opening portion 111b, and formed to surround the second opening portion 111b.

When the display sealing member 133 is fixed to the mounting frame 131, an accommodation groove 131f may be formed on the mounting frame 131, and configured to insert and fix part of the display sealing member 133 to the accommodation groove 131f. Another part of the display sealing member 133 may protrude from the accommodation groove 131f, and may contact the door frame 110 when the mounting frame 131 is mounted on the door frame 110. Due to the contact, an inner space of the display sealing member 133 may be separated from an outer space of the display sealing member 133, thereby preventing moisture from leaking into the inner space. As will be described later in connection with FIG. 24, the display sealing member 133 may be fixed to a rear surface of the outer frame 5111, and in this case, the accommodation groove 5111h that fixes the display sealing member 5133 may be provided on a rear surface of the outer frame 111.

On the other hand, a filler 133' may be filled into a gap between the mounting frame 131 and the display cover 134 when the display 132 is mounted on the display mounting portion 131a. The filler 133' may fill the gap, thereby preventing moisture from leaking into the display 132.

Figure 21:
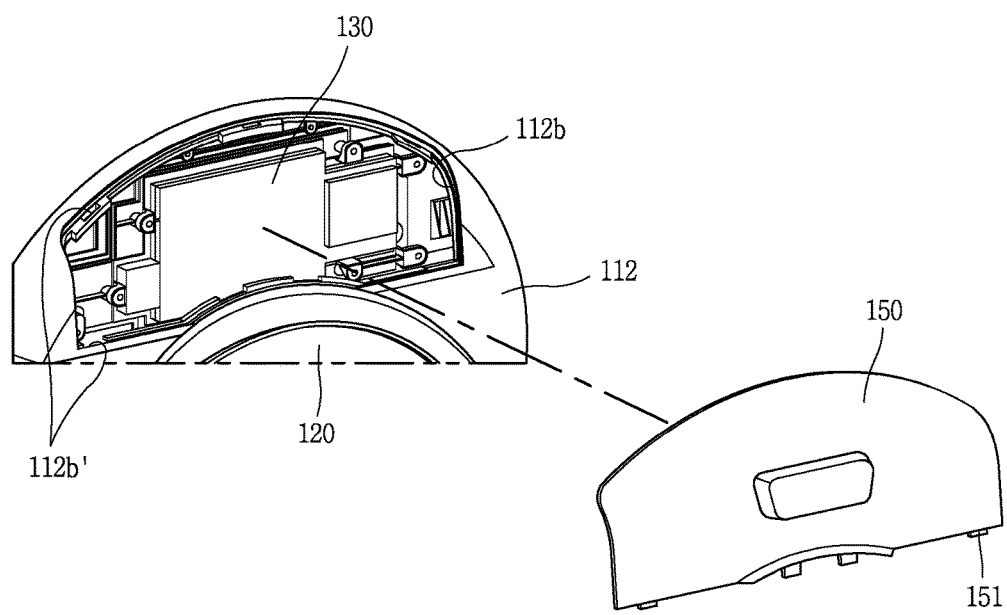
FIG. 21 is a conceptual view illustrating a configuration in which a display module illustrated in FIG. 3 is mounted within the door frame.

Referring to FIG. 21 along with the foregoing FIG. 20, the inner frame 112 may be coupled to a rear side of the outer frame 111, and may cover the display module 130. The display module 130 may be provided in an internal space formed by a coupling between the outer frame 111 and the inner frame 112.

The communication portion 112b configured to communicate with the internal space may be formed on the inner frame 112, and the display module 130 may be inserted into the internal space through the communication portion 112b, and then installed on the outer frame 111. A fastening boss corresponding to a fastening portion of the mounting frame 131 may be formed on the outer frame 111, and the fastening member 139a may be fastened to the fastening boss through the fastening hole of the fastening portion 131c.

The printed circuit board 135 may be electrically connected to a controller and a power supply unit of the body 20. A door side cable extended from the printed circuit board 135 may be connected to a connector provided within the outer frame 111, and the connector may be electrically connected to a body side cable electrically connected to the controller and power supply unit of the body 20.

The door side cable may pass through a through hole of the PCB cover 137, and a sealing member may be interposed between the door side cable and the through hole. The sealing member may be formed to surround the door side cable, and may be closely adhered to an inner circumferential surface of the PCB cover 137 forming the through hole.

The door frame 110 may further include a frame cover 150 that covers the display module 130 in addition to the foregoing outer frame 111 and inner frame 112. The frame cover 150 may be coupled to a rear side of the outer frame 111 along with the inner frame 112 to form a rear appearance of the door 10 along with the door window 120 when the door 10 is opened to open the laundry inlet 20a.

If the inner frame 112 forms an entire rear surface of the door 10 along with the door window 120 without the frame cover 150, then the entire inner frame 112 may have to separated during a repair of the display module 130, and the door window 120 mounted on the opening portion 112a of the inner frame may have to be separated at the same time.

However, when the frame cover 150 is provided as described above, an inner space of the door frame 110 may be opened and closed by a detachable frame cover. When the frame cover display portion 150 is separated, the display module 130 provided in the inner space may be exposed to a rear side of the door 10. Accordingly, repair of the display module 130 is required, only the frame cover 130 may be merely separated, thereby more easily carrying out the repair work.

The communication portion 112b may be provided at the inner frame 112, and the frame cover 150 may be detachably coupled to the communication portion 112b. The frame cover 150 may open and close the communication portion 112b and may be detachably coupled to the inner frame 112. The frame cover 150 may be fastened to the inner frame 112 by a screw coupling, a hook coupling, or the like. An engagement hook 151 may be protruded on the frame cover 150, and an engagement hole (or engagement groove) 112b' configured to be engaged with the engagement hook 151 may be formed on the inner frame 112.

Hereinafter, a modified example of the foregoing laundry treating apparatus will be described. The detailed structured of the foregoing door will be applicable as a whole to the following door unless it contradicts to the detailed description of the following door. Accordingly, the redundant description thereof will be omitted.

Figure 22:
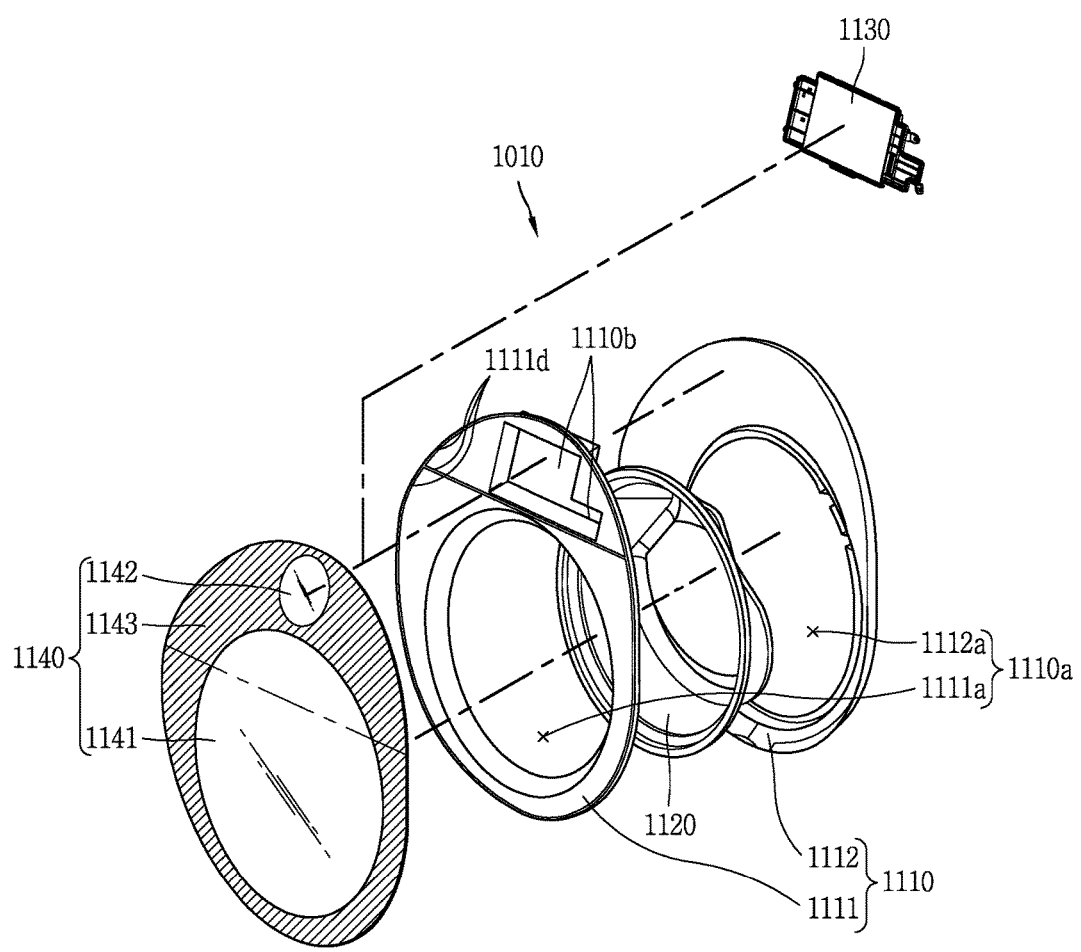
FIG. 22 is an exploded perspective view of a door according to a modified example.
Figure 23:
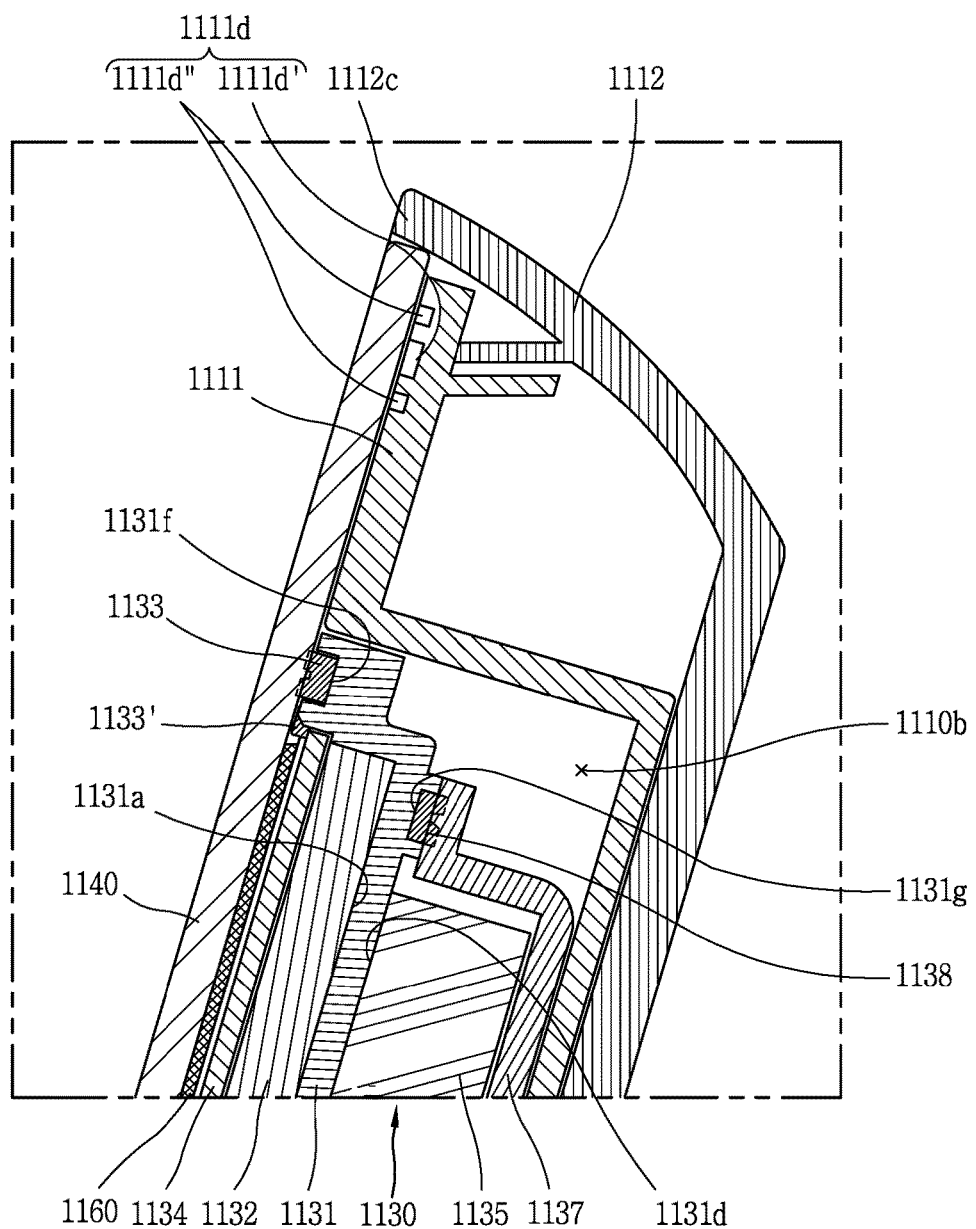
FIG. 23 is a cross-sectional view of a door illustrated in FIG. 22.

Referring to FIGS. 22 and 23, the door 1010 may include a door cover 1140, a display module 1130 and a door frame 1110. The door cover 1140 may include a non-light-transmitting region 1143 and a first light transmitting region 1141 and a second light transmitting region 1142 within the non-light-transmitting region 1143. The first and the second light transmitting region 1141, 1142 may be divided from each other by the non-light-transmitting region 1143.

The display module 1130 may be provided on a rear surface of the door cover 1140. The display module 1130 may display visual information through the second light transmitting region 1142. The display module 1130 may be directly adhered to a rear surface of the door cover 1140 or mounted on the display module accommodation portion 1110b of the following door frame 1110.

The door frame 1110 may be coupled to the door cover 1140, and connected to the body 20 in a relatively movable manner. The door frame 1110 may rotate with respect to the body 20 by the hinge unit 30.

The door frame 1110 may include an outer frame 1111 and an inner frame 1112. The outer frame 1111 and inner frame 1112 may be formed of a synthetic resin material (for example, ABS material, PC material, etc.). The door frame 1110 may include a display module accommodation module 1110b and an opening portion 1110a.

The display module accommodation module 1110b may be a recessed space and may accommodate the display module 1130. The display module accommodation module 1110b may be a hole formed in the outer frame 1111 itself configured with a recessed space. The inner frame 1112 may cover the hole formed on the outer frame 1111. The display module accommodation module 1110b may be configured to accommodate a flexible printed circuit board 1161 of the touch sensor 1160.

The display module 1130 may be covered by the display module accommodation module 1110b. The display module 1130 may be provided between the door cover 1140 and the door frame 1110. A second opening portion corresponding to the display module 1130 may not be provided, and the frame cover may not be provided on the door frame 1110.

The opening portion 1110a may face the laundry inlet 20a when the door 1010 is closed. A light transmitting door window 1120 may be installed on the opening portion 1110a, and configured to view the laundry inlet 20a through the door window 1120.

The opening portion 1110a may include a front side opening portion 1111a formed on the outer frame 1111 and a rear side opening portion 1112a formed on the inner frame 1112. A sealant filling groove 1111d configured to fill sealant to the door cover 1140 may be formed on a front surface of the door frame 1110.

The sealant filling groove 1111d may include a connecting groove portion, a first groove portion and a second groove portion. Specifically, the connecting groove portion may cross between the display module accommodation module 1110b and the opening portion 1110a, and the first groove portion may be connected to both end portions of the connecting groove portion to surround a circumference of the opening portion 1110a along with the connecting groove portion, and the second groove portion may be connected to both end portions of the connecting groove portion to surround a circumference of the display module accommodation module 1110b along with the connecting groove portion.

The sealant filling groove 1111d may further include a bypass groove portion in addition to the foregoing configuration. The bypass groove portion may connect an arbitrary point on the connecting groove portion with an arbitrary point on the first groove portion within a space formed by the connecting groove portion and the first groove portion. Furthermore, the sealant filling groove 1111d may include a sealant coating portion 1111d' and a sealant collecting portion 1111d".

Due to the sealant filling groove 1111d, it may be possible to prevent moisture from leaking into the display module 1130 provided between the door cover 1140 and the door frame 1110. Furthermore, the sealant filling groove 1111d may separately surround the display module accommodation module 1110b and the opening portion 1110a, respectively, thereby preventing moisture from leaking into the display module 1130 through the opening portion 1110a.

When the display module 1130 is directly adhered to a rear surface of the door cover 1140, a display sealing member 1133 may be closely adhered to a rear surface of the door cover 1140. Here, the display sealing member 1133 may also function as an adhesive to couple the display module 1130 to a rear surface of the door cover 1140.

Figure 24:
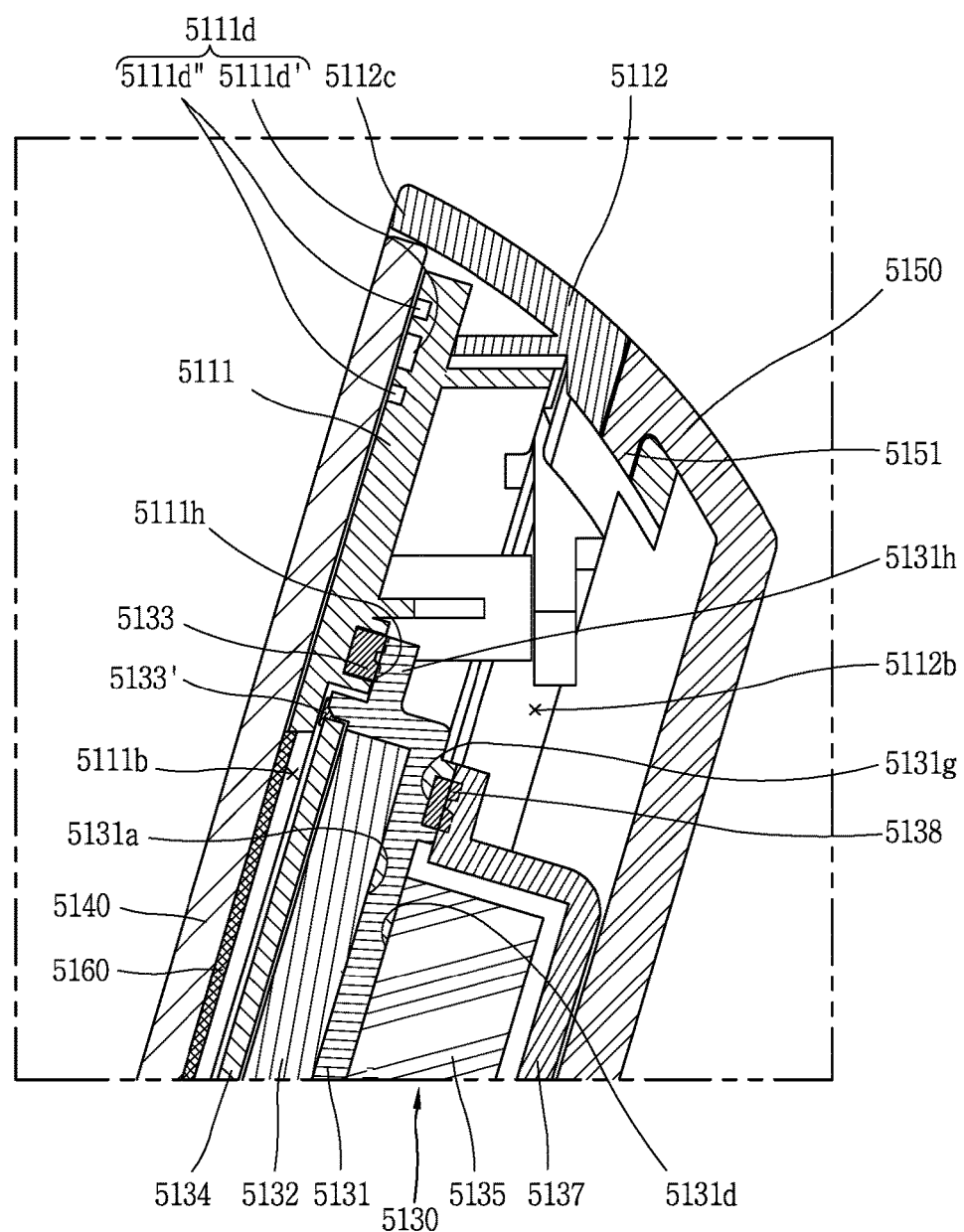
FIGS. 24 through 26 are cross-sectional views illustrating other modified examples of the present disclosure.

Referring to FIG. 24, the door cover 5140 may be mounted on a front surface of the outer frame 5111, and the mounting frame 5131 may be mounted on a rear surface of the outer frame 5111 to correspond to the second opening portion 5111b. When the mounting frame 5131 is mounted on the outer frame 5111, the display sealing member 5133 may seal a gap between the mounting frame 5131 and the outer frame 5111.

An accommodation groove 5111h that surrounds the second opening portion 5111b may be formed on the outer frame 5111, and configured such that part of the display sealing member 5133 is inserted and fixed to the accommodation groove 5111h. Another part of the display sealing member 5133 may protrude from the accommodation groove 5111h, and contact the mounting frame 5131 when the mounting frame 5131 is mounted on the outer frame 5111. Due to the contact, an inner space of the display sealing member 5133 may be separated from an outer space thereof, thereby preventing moisture from leaking into the inner space.

An extension portion 5131h of the mounting frame 5131 may extend in a lateral direction to cover a rear surface of the outer frame 5111, and the display sealing member 5133 inserted into the accommodation groove 5111h may contact the extension portion 5131h. The extension portion 5131h may extend along a circumference of the mounting frame 5131 to correspond to the display sealing member 5133.

Figure 25:
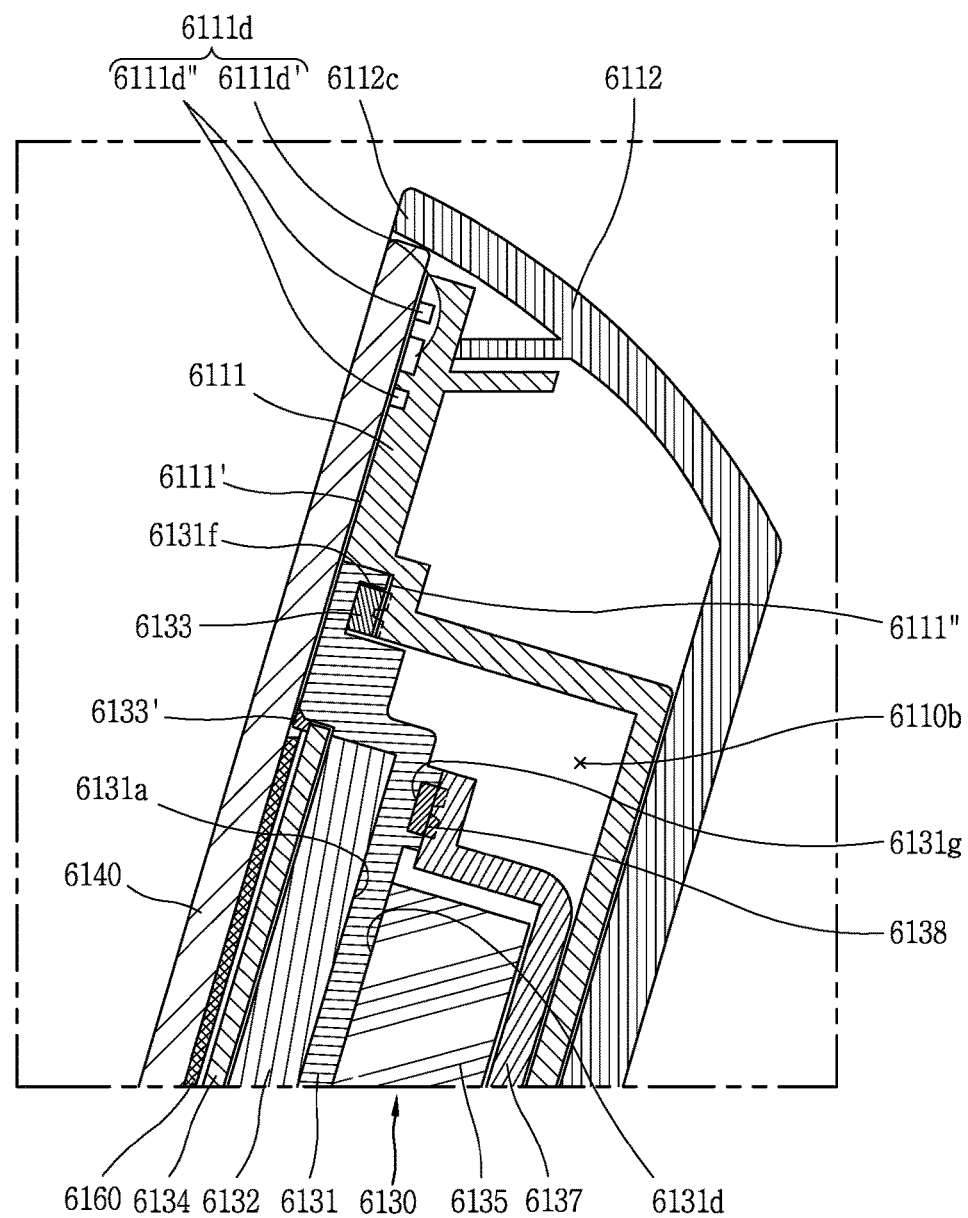
Figure 26:
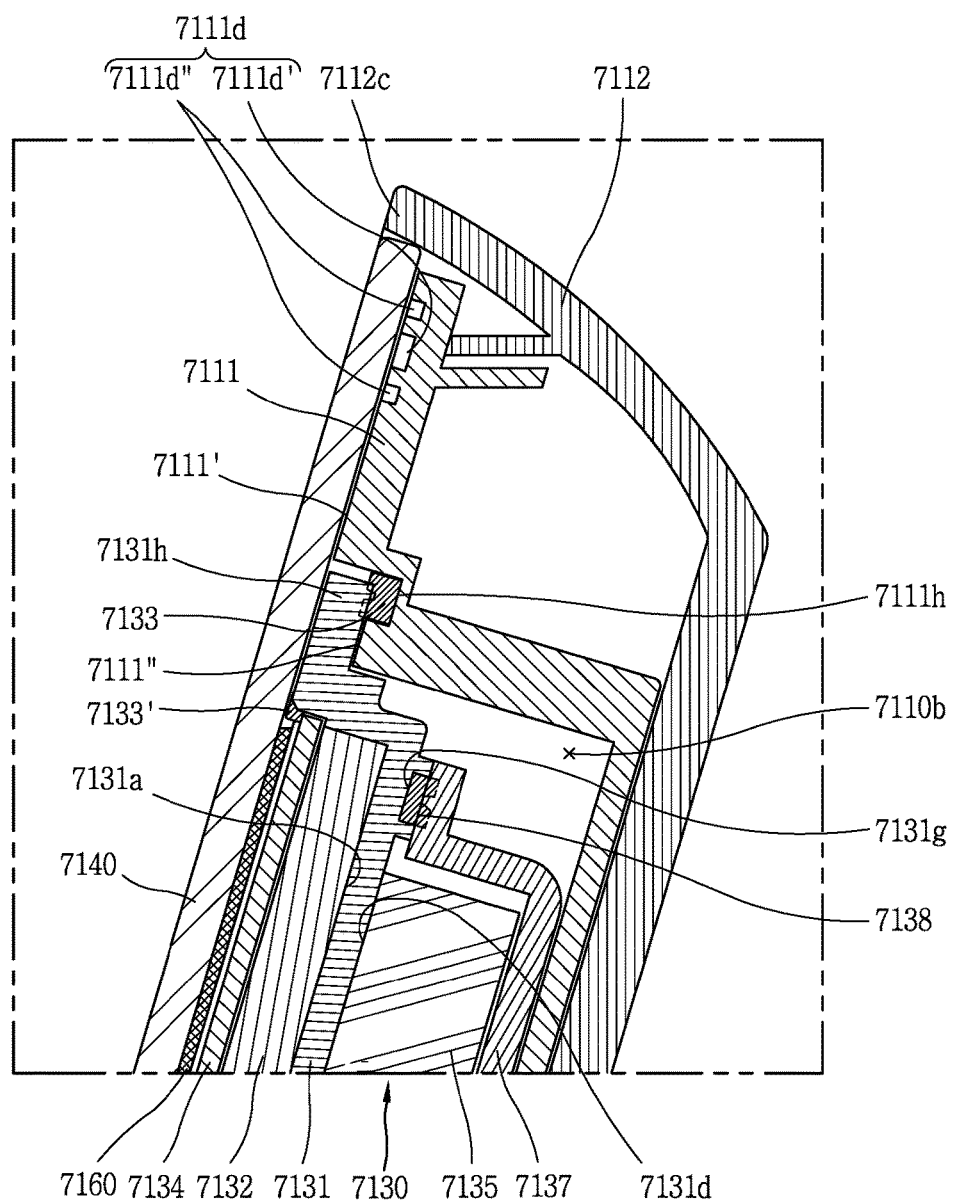

Referring to FIG. 25, the mounting frame 6131 may be mounted on a front surface of the door frame 6110 along with the door cover 6140. Specifically, a first mounting portion 6111' that mounts the door cover 6140 and a second mounting portion 6111" formed in a recessed shape at an inner side of the first mounting portion 6111' to mount the mounting frame 6131. The second mounting portion 6111" has an inwardly stepped shape with respect to the first mounting portion 6111'.

The mounting frame 6131 may be mounted on the second mounting portion 6111", and then the door cover 6140 may be mounted on the first mounting portion 6111'. The door cover 6140 may cover the mounting frame 6131 when the door cover 6140 is mounted on the outer frame 6111.

A display module accommodation portion 6110b in a recessed shape may be provided in the outer frame 6111. The second mounting portion 6111" may extend in a loop shape to surround the display module accommodation portion

6110b. However, a second opening portion may be provided in the outer frame 6111 corresponding to the display module 6130.

When the mounting frame 6131 is mounted on the second mounting portion 6111" of the outer frame 6111, the sealing member 6133 may seal a gap between the mounting frame 6131 and the second mounting portion 6111" of the outer frame 6111. An accommodation groove 6131f may be formed in a loop shape corresponding to the second mounting portion 6111" at a portion facing the second mounting portion 6111" on the mounting frame 6131, and configured such that part of the sealing member 6133 is inserted and fixed to the accommodation groove 6131f. Another part of the display sealing member 6133 may protrude from the accommodation groove 6131h, contact the second mounting portion 6111" when the mounting frame 6131 is mounted on the outer frame 6111.

When the door cover 6140 is mounted on the first mounting portion 6111', the mounting frame 6131 may be pressurized by the door cover 6140 to pressurize the second mounting portion 6111". An adhesiveness of the sealing member 6133 to the second mounting portion 6111" by the pressurization may be increased to enhance the reliability of the sealing.

The sealing groove 7111h may be formed on the second mounting portion 7111" of the outer frame 7111, extended along the second mounting portion 7111", and configured to surround the display module accommodation portion 7110b. Part of the display sealing member 7133 may be inserted and fixed to the accommodation groove 7111h, and another part of the display sealing member 7133 may protrude from the accommodation groove 7111h, and the mounting frame 7131 may contact the mounting frame 7131 when the mounting frame 7131 is mounted on the outer frame 7111.

An extension portion 7131h of the mounting frame 7131 may extend in a lateral direction to cover the second mounting portion 7111" of the outer frame 7111, and the display sealing member 7133 inserted into the accommodation groove 7111h may contact the extension portion 7131h. The extension portion 7131h may extend along a circumference of the mounting frame 7131 to correspond to the display sealing member 7133.

When the door cover 7140 is mounted on the first mounting portion 7111', the mounting frame 7131 may be pressurized by the door cover 7140 to pressurize the second mounting portion 7111". An adhesiveness of the sealing member 7133 to the second mounting portion 7111" by the pressurization may be increased to enhance the reliability of the sealing.

As described above, the display sealing member 5133, 6133, 7133 that seals a gap between the door frame (outer frame 5111, 6111, 7111 in the modified examples) and the mounting frame 5131, 6131, 7131 may be mounted on the accommodation groove 5111h, 6131f, 7111h formed on either one and closely adhered to the other one of the door frame and the mounting frame 5131, 6131, 7131. Here, the mounting frame 5131, 6131, 7131 may be coupled to a front surface or rear surface of the door frame.

Furthermore, when the display sealing member 1133 seals a gap between the door cover 1140 and the mounting frame 1131 as illustrated in a structure disclosed in FIG. 23, for a modified example regarding this, the display sealing member 1133 may be mounted on an accommodation groove formed on the door cover 1140, and may contact the mounting frame 1131. The foregoing design change may be also applicable to a structure for sealing between the mounting frame 131 and the PCB cover 137. In other words, the PCB sealing member 138 may be mounted on the mounting guide 131g formed on either one of the mounting frame 131 and the PCB cover 137, and may contact the other one thereof.

The second protrusion portion may be formed at a lower side of the door frame. The door frame may include an outer frame formed with a sealant filling groove to fill sealant to adhere to the door cover on a front surface thereof; and an inner frame coupled to a rear side of the outer frame, and formed such that an outer circumferential portion thereof protrudes from a front surface of the outer frame during the coupling to form the mounting guide.

The sealant filling groove may include a sealant coating portion for filling sealant; and a sealant collecting portion formed at both sides of the sealant coating portion, respectively, to collect sealant leaked out of an inner and an outer side of the sealant coating portion, respectively. The sealant filling groove may include a connecting groove portion formed to cross between the first and the second opening portion; a first groove portion connected to both end portions of the connecting groove portion, and formed to surround a circumference of the first opening portion along with the connecting groove portion; and a second groove portion connected to both end portions of the connecting groove portion, and formed to surround a circumference of the second opening portion along with the connecting groove portion.

The sealant filling groove may further include a bypass groove portion configured to connect between an arbitrary point on the connecting groove portion and an arbitrary point on the first groove portion. The bypass groove portion may be located within a space formed by the connecting groove portion and the first groove portion.

The body may include a door accommodation portion recessed in an inward direction on an outer surface thereof to have the laundry inlet therewithin, and when the door is closed, the door may be accommodated into the door accommodation portion, and an edge portion of the outer surface of the door cover may form the same plane as that of an outer surface of the body adjacent thereto.

A laundry treating apparatus may include a body provided with a laundry inlet; and a door configured to open and close the laundry inlet, wherein the door includes a door frame having a first opening portion facing the laundry inlet inside when the door is closed and a second opening portion corresponding to a display module mounted at an inside; and a door cover coupled to the door frame to cover the first and the second opening portion so as to form an appearance of the door, and a sealant filling groove configured to fill sealant to adhere to the door cover, and formed to surround the first and the second opening portion, respectively, may be formed on the door frame.

The sealant filling groove may include a connecting groove portion formed to cross between the first and the second opening portion; a first groove portion connected to both end portions of the connecting groove portion, and formed to surround a circumference of the first opening portion along with the connecting groove portion; and a second groove portion connected to both end portions of the connecting groove portion, and formed to surround a circumference of the second opening portion along with the connecting groove portion.

The sealant filling groove may further include a first sealant collecting portion formed to surround the first opening portion in an inner space formed by the connecting groove portion and the first groove portion; a second sealant collecting portion formed to surround the second opening portion in an inner space formed by the connecting groove portion and the second groove portion; and a third sealant collecting portion formed to surround the first groove portion and the second groove portion.

A laundry treating apparatus may include a body provided with a laundry inlet; and a door configured to open and close the laundry inlet, wherein the door includes a door frame configured to relatively move with respect to the body; a door cover coupled to the door frame to form an appearance of the door, and configured to have a non-light-transmitting region and a light transmitting region within the non-light-transmitting region; and a display module provided on a rear surface of the door cover to display visual information through the light transmitting region, and the light transmitting region is formed with a smaller size than that of the display module, and disposed to overlap within the display module when the door cover is coupled to the door frame.

The display module may be formed in a rectangular shape, and the light transmitting region may be formed in a circular shape disposed to overlap with part of the display module, and the non-light-transmitting region may cover another part of the display module that does not overlap with the light transmitting region. Visual information may not be displayed on another part of the display module. A touch sensor covering the light transmitting region and part of the non-light-transmitting region around the light transmitting region may be adhered to a rear surface of the door cover.

A laundry treating apparatus may include a body provided with a laundry inlet; and a door configured to open and close the laundry inlet, wherein the door includes a door cover configured to form an appearance of the door, and configured to have a first edge portion formed in a round manner and a second edge portion for connecting both sides of the first edge portion; and a door frame configured to relatively move with respect to the body, and on which a mounting guide configured to surround an outer circumference of the door cover is formed in a protruding manner along a circumference thereof, and the mounting guide includes a first protrusion portion extended in a round manner to correspond to the first edge portion; and a second protrusion portion formed to correspond to the second edge portion to guide a mounting position when the door cover is mounted on the door frame. The second protrusion portion may be formed at a lower side of the door frame.

A laundry treating apparatus may include a body provided with a laundry inlet; and a door configured to open and close the laundry inlet, wherein the door includes a door cover configured to form an appearance of the door, and configured to have a non-light-transmitting region and a light transmitting region within the non-light-transmitting region; a display module provided on a rear surface of the door cover to display visual information through the light transmitting region; and a door frame configured to have a display module accommodation portion to accommodate the display module and an opening portion facing the laundry inlet in a state that the door is closed, and formed with a sealant filling groove configured to fill sealant for adhesion to the door cover on a front surface thereof.

The sealant filling groove may include a connecting groove portion formed to cross between the display module accommodation portion and the opening portion; a first groove portion connected to both end portions of the connecting groove portion, and formed to surround a circumference of the opening portion along with the connecting groove portion; and a second groove portion connected to both end portions of the connecting groove portion, and formed to surround a circumference of the display module accommodation portion along with the connecting groove portion.

The sealant filling groove may further include a bypass groove portion configured to connect between an arbitrary point on the connecting groove portion and an arbitrary point on the first groove portion within a space formed by the connecting groove portion and the first groove portion. The sealant filling groove may include a sealant coating portion for filling sealant; and a sealant collecting portion formed at both sides of the sealant coating portion to collect sealant leaked out of an inner and an outer side of the sealant coating portion, respectively.

A laundry treating apparatus may include a body provided with a laundry inlet; and a door configured to open and close the laundry inlet, wherein the door may include a door frame; a door cover mounted at one side of the door frame, and provided with a light transmitting region; a mounting frame mounted at the other side of the door frame; a display mounted on the mounting frame to display visual information through the light transmitting region of the door cover; and a display sealing member disposed between the door frame and the mounting frame, and formed to surround the display.

An accommodation groove formed to accommodate part of the display sealing member and surround the display may be formed on the mounting frame. Another part of the display sealing member may be formed to be protruded from the accommodation groove, and brought into contact with the door frame when the mounting frame is mounted on the door frame. The display sealing member may be provided with a plurality of contact portions brought into contact with the door frame, respectively, and the plurality of contact portions may be disposed to be separated from each other in a width direction, and extended in parallel along a length direction to form a plurality of sealing loops.

The laundry treating apparatus may further include a display cover formed of a light transmitting material, and arranged to cover the display; and a filler configured to fill a gap between the mounting frame and the door cover. The door frame may include an outer frame formed with a sealant filling groove to fill sealant to adhere to the door cover on a front surface; and an inner frame coupled to a rear side of the outer frame, and arranged to cover the mounting frame.

A laundry treating apparatus may include a body provided with a laundry inlet; and a door configured to open and close the laundry inlet, wherein the door includes a door frame provided with an opening portion corresponding to the laundry inlet; and a door cover provided with a first edge portion coupled to the door frame to form an appearance of the door, and formed in a circular shape in a round manner and a second edge portion for connecting both sides of the first edge portion in a linear shape, wherein a mounting guide configured to surround an outer circumference of the door cover along a circumference thereof is formed in a protruding manner on the door frame, and the mounting guide includes a first protrusion portion extended in a round manner to correspond to the first edge portion and a second protrusion portion extended in a linear shape to correspond to the second edge portion. The second protrusion portion may be formed at a lower side of the door frame.

A laundry treating apparatus may include a body provided with a laundry inlet; and a door configured to open and close the laundry inlet, wherein the door includes a door frame; a door cover coupled to the door frame to form an appearance of the door, and provided with a non-light-transmitting region and a light transmitting region; a display module mounted on the door frame to display visual information through the light transmitting region of the door cover; and a touch sensor adhered to a rear surface of the door cover to sense a touch input to the light transmitting region, and the touch sensor forms a sensing region including the light transmitting region and at least part of the non-light-transmitting region adjacent to the light transmitting region. The laundry treating apparatus may further include a controller configured to control whether to activate touch sensing to a region that does not correspond to the light transmitting region within the sensing region.

The light transmitting region may be formed to be smaller than the display, and may overlap with the display module when the door cover is coupled to the door frame, and visual information may not be displayed on a portion that does not correspond to the light transmitting region within the display module.

A laundry treating apparatus may include a body provided with a laundry inlet; and a door configured to open and close the laundry inlet, wherein the door includes a door frame; a door cover mounted on the door frame, and provided with a light transmitting region; a mounting frame mounted on the door frame; a display mounted on the mounting frame to display visual information through the light transmitting region of the door cover; and a display sealing member disposed between the door frame and the mounting frame, and formed to surround the display. An accommodation groove formed to accommodate part of the display sealing member and surround the display may be formed on either one of the mounting frame and the door frame.

Another part of the display sealing member may protrude from the accommodation groove, and may contact the other one of the mounting frame and the door frame when the mounting frame is mounted on the door frame. The display sealing member may be provided with a plurality of contact portions brought into contact with the other one of the mounting frame and the door frame, respectively, and the plurality of contact portions may be separated from each other in a width direction, and extended in parallel along a length direction to form a plurality of sealing loops.

The laundry treating apparatus may further include a display cover formed of a light transmitting material, and disposed to cover the display; and a filler configured to fill a gap between the mounting frame and the display cover. The door frame may include an outer frame formed with a sealant filling groove to fill sealant for adhesion to the door cover on a front surface; and an inner frame coupled to a rear side of the outer frame, and disposed to cover the mounting frame.

A circumferential portion of the inner frame may form a mounting guide protruded from a front surface of the outer frame to surround an outer circumference of the door cover. A communication portion configured to communicate with an inner space formed by the outer frame and the inner frame may be formed on the inner frame, and a frame cover configured to open and close the communication portion may be detachably coupled to the inner frame.

The laundry treating apparatus may further include a touch sensor adhered to a rear surface of the door cover to sense a touch input to the light transmitting region. A display hole corresponding to the display and a communication hole passing through a flexible printed circuit board (FPCB) of the touch sensor may be formed on the door frame, and the display sealing member may be formed to surround the display hole and the communication hole.

The display may be mounted at one side of the mounting frame, and a printed circuit board (PCB) electrically connected to the display and the flexible printed circuit board may be mounted at the other side thereof. A wireless communication module capable of performing wireless communication with an external electronic device may be further mounted at the other side of the mounting frame.

The laundry treating apparatus may further include a PCB cover mounted on the mounting frame and disposed to cover the printed circuit board; and a PCB sealing member disposed between the mounting frame and the PCB cover and formed to surround the printed circuit board. The PCB sealing member may be formed to surround the FPCB hole.

A mounting groove configured to accommodate part of the PCB sealing member, and formed to surround the printed circuit board may be formed on either one of the mounting frame and the PCB cover. Another part of the PCB sealing member may protrude from the mounting groove, and may contact the other one of the mounting frame and the PCB cover when the PCB cover is mounted on the mounting frame. The PCB sealing member may be provided with a plurality of contact portions brought into contact with the other one of the mounting frame and the PCB cover, respectively, and the plurality of contact portions may be separated from each other in a width direction, and extended in parallel along a length direction to form a plurality of sealing loops.

A laundry treating apparatus may include a body provided with a laundry inlet; and a door configured to open and close the laundry inlet, wherein the door includes a door frame configured to relatively move with respect to the body; a door cover coupled to the door frame to form an appearance of the door; and a display module provided on a rear surface of the door cover, and the display module includes a mounting frame provided with a display mounting portion and a printed circuit board mounting portion at both side thereof, respectively; a PCB cover mounted on the mounting frame to cover the printed circuit board mounting portion; a display sealing member provided between the door frame and the mounting frame, and formed to surround the display mounting portion; and a PCB sealing member provided between the mounting frame and the PCB cover, and formed to surround the printed circuit board mounting portion.

The display sealing member may be provided with a plurality of contact portions brought into contact with the mounting frame, respectively, and the plurality of contact portions may be separated from each other in a width direction, and extended in parallel along a length direction to form a plurality of sealing loops. The PCB sealing member may have a plurality of contact portions brought into contact with the PCB cover, respectively, and the plurality of contact portions may be separated from each other in a width direction, and extended in parallel along a length direction to form a plurality of sealing loops.

A non-light-transmitting region and a first and a second light transmitting region divided from each other within the non-light-transmitting region may be formed on a door cover, and a window unit (or window) and a display unit (or touch screen) may be formed in the first and the second light transmitting region, respectively, to implement a simple door appearance. In particular, when the first and the second light transmitting region are formed in a circular shape to correspond to a circular shaped door, it may be possible to give an integrated aesthetic sense to the user.

Moreover, the second light transmitting region may be formed in a circular shape overlapping within a rectangular display, and visual information may be displayed only on a portion corresponding to the circular shaped second light transmitting region, thereby providing a circular shaped display unit to the user. Here, the controller may control the display of visual information to a portion that does not correspond to the second light transmitting region within the display, thereby reducing power.

A mounting guide of the door frame may be configured with a first protrusion portion in a round shape and a second protrusion portion in a linear shape corresponding to a first and a second edge portion of the door, respectively, and thus the door cover may be a reference point capable of adjusting an installation position between the second edge portion and the second protrusion portion when the door cover is assembled to the door frame. In other words, when the second edge portion corresponds to the second protrusion portion, the door cover may be located at a normal position on the door frame, and thus the first and the second light transmitting region of the door cover may correspond to the first and the second opening portion of the door frame.

Even though sealant filled into the sealant coating portion is leaked out during the process of coupling the door cover to the outer frame, it is configured to collect sealant leaked into the sealant collecting portion provided at an inner and an outer side of the sealant coating portion, respectively. As a result, it may be possible to prevent the deterioration of appearance quality due to the leakage of sealant.

Furthermore, the sealant coating portion may be adjacent to an edge portion of the outer frame. Accordingly, it may be possible to minimize a non-joint portion on an edge portion of the corresponding door cover, thereby enhancing the joint strength, and effectively preventing foreign substances from leaking through a gap between the door cover and the outer frame.

A display sealing member may be provided between the door frame and the mounting frame, thus having a structure capable of preventing moisture from being infiltrated into a flexible printed circuit board between the display and the touch screen provided therein. Here, a filler may be filled into a gap between the mounting frame and the door cover, and in this case, it may be possible to prevent moisture from being infiltrated into the display once more.

Furthermore, a PCB sealing member may be provided between the mounting frame and the PCB cover, thus having a structure capable of preventing moisture from leaking into the printed circuit board and wireless communication module. The display sealing member and PCB sealing member may include a plurality of contact portions separated from each other in a width direction, and extending in parallel along a length direction to form a plurality of sealing loops. In this case, a sealing loop formed by any one contact portion may be located within a sealing loop formed by another contact portion, thereby enhancing the reliability of the sealing structure.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A laundry treating apparatus, comprising:
a body provided with a laundry inlet; and
a door configured to open or close the laundry inlet, wherein the door includes:
 a door frame having a first opening portion facing the laundry inlet when the door is closed and a second opening portion spaced from the first opening;
 a door cover mounted to a front surface of the door frame, and including a non-light-transmitting region, and a first light transmitting region corresponding to the first opening portion and a second light transmitting region corresponding to the second opening portion within the non-light-transmitting region;
 a mounting frame mounted to a rear surface of the door frame so as to cover the second opening portion;
 a display mounted to the mounting frame to display visual information through the second light transmitting region;
 a display sealing member disposed between the door frame and the mounting frame and formed to surround the second opening portion on a rear surface of the door frame; and
 a sealant filling groove which forms a space for filling sealant for adhesion with the door cover on a front surface of the door frame, and formed to surround the first opening portion and the second opening portion, separately, on the front surface of the door frame.

2. The laundry treating apparatus of claim 1, wherein an accommodation groove for accommodating a part of the display sealing member is formed at one of the mounting frame and the door frame, so as to surround the display, and
 wherein another part of the display sealing member protrudes from the accommodation groove to contact another of the mounting frame and the door frame when the mounting frame is mounted to the door frame.

3. The laundry treating apparatus of claim 2, wherein the display sealing member is provided with a plurality of contact portions each contacting another of the mounting frame and the door frame, and
 wherein the plurality of contact portions are separated from each other in a width direction, and extend in parallel along a length direction to form a plurality of sealing loops.

4. The laundry treating apparatus of claim 1, further including:
 a display cover formed of a light transmitting material, and covering the display; and
 a filler that fills a gap between the mounting frame and the display cover.

5. The laundry treating apparatus of claim 1, wherein the door frame includes:
 an outer frame formed with the sealant filling groove on a front surface thereof; and
 an inner frame coupled to a rear side of the outer frame.

6. The laundry treating apparatus of claim 5, wherein a circumferential portion of the inner frame forms a mounting guide protruding from a front surface of the outer frame to surround an outer circumference of the door cover.

7. The laundry treating apparatus of claim 5, wherein the mounting frame is mounted on a rear surface of the outer frame, and a frame cover is mounted at a rear surface side of the outer frame to cover the mounting frame.

8. The laundry treating apparatus of claim 1, further including a touch sensor adhered to a rear surface of the door cover to sense a touch input to the second light transmitting region.

9. The laundry treating apparatus of claim 8, wherein a communication hole passing through a flexible printed circuit board (FPCB) of the touch sensor is formed on the door frame, and
wherein the display sealing member are formed to surround the second opening portion and the communication hole.

10. The laundry treating apparatus of claim 9, wherein the display is mounted at a first side of the mounting frame, and a printed circuit board (PCB) electrically connected to the display and the flexible printed circuit board is mounted at a second side of the mounting frame.

11. The laundry treating apparatus of claim 10, wherein a wireless communication module capable of performing wireless communication with an external electronic device is further mounted at the second side of the mounting frame.

12. The laundry treating apparatus of claim 10, further including:
a PCB cover mounted on the mounting frame and covering the printed circuit board; and
a PCB sealing member provided between the mounting frame and the PCB cover and surrounding the printed circuit board and the communication hole.

13. The laundry treating apparatus of claim 12, wherein a mounting groove for accommodating a part of the PCB sealing member is formed at one of the mounting frame and the PCB cover, so as to surround the PCB, and
wherein another part of the PCB sealing member protrudes from the mounting groove to contact another of the mounting frame and the PCB cover when the PCB cover is mounted to the mounting frame.

14. The laundry treating apparatus of claim 13, wherein the PCB sealing member is provided with a plurality of contact portions that contact another of the mounting frame and the PCB cover, respectively, and
wherein the plurality of contact portions are separated from each other in a width direction, and extend in parallel along a length direction to form a plurality of sealing loops.

* * * * *